US008093670B2

(12) United States Patent
Taylor

(10) Patent No.: US 8,093,670 B2
(45) Date of Patent: Jan. 10, 2012

(54) METHODS AND APPARATUS FOR INTEGRATED CIRCUIT HAVING ON CHIP CAPACITOR WITH EDDY CURRENT REDUCTIONS

(75) Inventor: William P. Taylor, Amherst, NH (US)

(73) Assignee: Allegro Microsystems, Inc., Worcester, MA (US)

( * ) Notice: Subject to any disclaimer, the term of this patent is extended or adjusted under 35 U.S.C. 154(b) by 670 days.

(21) Appl. No.: 12/178,781

(22) Filed: Jul. 24, 2008

(65) Prior Publication Data
US 2010/0019332 A1    Jan. 28, 2010

(51) Int. Cl.
*H01L 27/22* (2006.01)

(52) U.S. Cl. ............... 257/427; 438/393; 257/E27.006

(58) Field of Classification Search ........... 257/427, 257/414, E27.005, E21.008; 438/393
See application file for complete search history.

(56) References Cited

U.S. PATENT DOCUMENTS

| | | | |
|---|---|---|---|
| 4,409,608 A | 10/1983 | Yoder | |
| 4,425,596 A | 1/1984 | Satou | |
| 4,893,073 A | 1/1990 | McDonald et al. | |
| 4,994,731 A | 2/1991 | Sanner | |
| 5,041,780 A | 8/1991 | Rippel | |
| 5,124,642 A | 6/1992 | Marx | |
| 5,244,834 A | 9/1993 | Suzuki et al. | |
| 5,247,202 A | 9/1993 | Popovic et al. | |
| 5,399,905 A | 3/1995 | Honda et al. | |
| 5,414,355 A | 5/1995 | Davidson et al. | |
| 5,434,105 A | 7/1995 | Liou | |
| 5,442,228 A | 8/1995 | Pham et al. | |
| 5,539,241 A | 7/1996 | Abidi et al. | |
| 5,561,366 A | 10/1996 | Takahashi et al. | |
| 5,563,199 A | 10/1996 | Harada et al. | |
| 5,579,194 A | 11/1996 | Mackenzie et al. | |
| 5,581,179 A | 12/1996 | Engel et al. | |
| 5,615,075 A | 3/1997 | Kim | |
| 5,648,682 A | 7/1997 | Nakazawa et al. | |
| 5,666,004 A | 9/1997 | Bhattacharyya et al. | |
| 5,691,869 A | 11/1997 | Engel et al. | |
| 5,714,405 A | 2/1998 | Tsubosaki et al. | |
| 5,726,577 A | 3/1998 | Engel et al. | |
| 5,729,130 A | 3/1998 | Moody et al. | |

(Continued)

FOREIGN PATENT DOCUMENTS
DE      40 31 560 A1    4/1992
(Continued)

OTHER PUBLICATIONS

Notification of Transmittal of the International Search Report and the Written Opinion of the International Searching Authority, or the Declaration, PCT/US2010/056434 date of mailing Jan. 26, 2011, 5 pages.

(Continued)

*Primary Examiner* — Thao Le
*Assistant Examiner* — Tanika Warrior
(74) *Attorney, Agent, or Firm* — Daly, Crowley, Mofford & Durkee, LLP

(57) ABSTRACT

Methods and apparatus for providing an integrated circuit including a substrate having a magnetic field sensor, first and second conductive layers generally parallel to the substrate, and a dielectric layer disposed between the first and second conductive layers such that the first and second conductive layers and the dielectric layer form a capacitor, wherein a slot is formed in at least one of the first and second conductive layers proximate the magnetic field sensor for reducing eddy currents in the first and second conductive layers.

22 Claims, 14 Drawing Sheets

U.S. PATENT DOCUMENTS

| | | | |
|---|---|---|---|
| 5,804,880 | A | 9/1998 | Mathew |
| 5,822,849 | A | 10/1998 | Casali et al. |
| 5,912,556 | A | 6/1999 | Frazee et al. |
| 5,940,256 | A | 8/1999 | MacKenzie et al. |
| 5,973,388 | A | 10/1999 | Chew et al. |
| 6,005,383 | A | 12/1999 | Savary et al. |
| 6,057,997 | A | 5/2000 | MacKenzie et al. |
| 6,097,109 | A | 8/2000 | Fendt et al. |
| 6,150,714 | A | 11/2000 | Andreycak et al. |
| 6,178,514 | B1 | 1/2001 | Wood |
| 6,252,389 | B1 | 6/2001 | Baba et al. |
| 6,265,865 | B1 | 7/2001 | Engel et al. |
| 6,316,736 | B1 | 11/2001 | Jairazbhoy et al. |
| 6,316,931 | B1 | 11/2001 | Nakagawa et al. |
| 6,323,634 | B1 | 11/2001 | Nakagawa et al. |
| 6,356,068 | B1 | 3/2002 | Steiner et al. |
| 6,359,331 | B1 | 3/2002 | Rinehart et al. |
| 6,396,712 | B1 | 5/2002 | Kuijk |
| 6,411,078 | B1 | 6/2002 | Nakagawa et al. |
| 6,420,779 | B1 | 7/2002 | Sharma et al. |
| 6,424,018 | B1 | 7/2002 | Ohtsuka |
| 6,429,652 | B1 | 8/2002 | Allen et al. |
| 6,445,171 | B2 | 9/2002 | Sandquist et al. |
| 6,462,531 | B1 | 10/2002 | Ohtsuka |
| 6,480,699 | B1 | 11/2002 | Lovoi |
| 6,486,535 | B2 | 11/2002 | Liu |
| 6,501,270 | B1 | 12/2002 | Opie |
| 6,504,366 | B2 | 1/2003 | Bodin et al. |
| 6,545,456 | B1 | 4/2003 | Radosevich et al. |
| 6,563,199 | B2 | 5/2003 | Yasunaga et al. |
| 6,566,856 | B2 | 5/2003 | Sandquist et al. |
| 6,608,375 | B2 | 8/2003 | Terui et al. |
| 6,610,923 | B1 | 8/2003 | Nagashima et al. |
| 6,617,846 | B2 | 9/2003 | Hayat-Dawoodi et al. |
| 6,642,609 | B1 | 11/2003 | Minamio et al. |
| 6,642,705 | B2 | 11/2003 | Kawase |
| 6,667,682 | B2 | 12/2003 | Wan et al. |
| 6,683,448 | B1 | 1/2004 | Ohtsuka |
| 6,696,952 | B2 | 2/2004 | Zirbes |
| 6,713,836 | B2 | 3/2004 | Liu et al. |
| 6,727,683 | B2 | 4/2004 | Goto et al. |
| 6,737,298 | B2 | 5/2004 | Shim et al. |
| 6,747,300 | B2 | 6/2004 | Nadd et al. |
| 6,759,841 | B2 | 7/2004 | Goto et al. |
| 6,775,140 | B2 | 8/2004 | Shim et al. |
| 6,781,359 | B2 | 8/2004 | Stauth et al. |
| 6,791,313 | B2 | 9/2004 | Ohtsuka |
| 6,798,057 | B2 | 9/2004 | Bolkin et al. |
| 6,809,416 | B1 | 10/2004 | Sharma |
| 6,812,687 | B1 | 11/2004 | Ohtsuka |
| 6,821,687 | B2 | 11/2004 | Ohtsuka |
| 6,825,067 | B2 | 11/2004 | Ararao et al. |
| 6,832,420 | B2 | 12/2004 | Liu |
| 6,841,989 | B2 | 1/2005 | Goto et al. |
| 6,853,178 | B2 | 2/2005 | Hayat-Dawoodi |
| 6,861,283 | B2 | 3/2005 | Sharma |
| 6,867,573 | B1 | 3/2005 | Carper |
| 6,875,634 | B2 | 4/2005 | Shim et al. |
| 6,921,955 | B2 | 7/2005 | Goto |
| 6,960,493 | B2 | 11/2005 | Ararao et al. |
| 6,974,909 | B2 | 12/2005 | Tanaka et al. |
| 6,989,665 | B2 | 1/2006 | Goto et al. |
| 6,995,315 | B2 | 2/2006 | Sharma et al. |
| 7,005,325 | B2 | 2/2006 | Chow et al. |
| 7,006,749 | B2 | 2/2006 | Illich et al. |
| 7,026,808 | B2 | 4/2006 | Vig et al. |
| 7,075,287 | B1 | 7/2006 | Mangtani et al. |
| 6,770,163 | B1 | 8/2006 | Kuah et al. |
| 7,166,807 | B2 | 1/2007 | Gagnon et al. |
| 7,248,045 | B2 | 7/2007 | Shoji |
| 7,250,760 | B2 | 7/2007 | Ao |
| 7,259,545 | B2 | 8/2007 | Stauth et al. |
| 7,259,624 | B2 | 8/2007 | Barnett |
| 7,265,531 | B2 | 9/2007 | Stauth et al. |
| 7,304,370 | B2 | 12/2007 | Imaizumi et al. |
| 7,358,724 | B2 | 4/2008 | Taylor et al. |
| 7,378,721 | B2 | 5/2008 | Frazee et al. |
| 7,378,733 | B1 | 5/2008 | Hoang et al. |
| 7,385,394 | B2 | 6/2008 | Auburger et al. |
| 7,476,816 | B2 | 1/2009 | Doogue et al. |
| 7,476,953 | B2 | 1/2009 | Taylor et al. |
| 7,518,493 | B2 | 4/2009 | Bryzek et al. |
| 7,573,112 | B2 | 8/2009 | Taylor |
| 7,598,601 | B2 | 10/2009 | Taylor |
| 7,676,914 | B2 | 3/2010 | Taylor |
| 7,687,882 | B2 | 3/2010 | Taylor |
| 7,696,006 | B1 | 4/2010 | Hoang et al. |
| 7,768,083 | B2 | 8/2010 | Doogue et al. |
| 7,777,607 | B2 | 8/2010 | Taylor et al. |
| 2001/0028115 | A1 | 10/2001 | Yanagawa et al. |
| 2001/0052780 | A1 | 12/2001 | Hayat-Dawoodi |
| 2002/0005780 | A1 | 1/2002 | Ehrlich et al. |
| 2002/0027488 | A1 | 3/2002 | Hayat-Dawoodi et al. |
| 2002/0179987 | A1 | 12/2002 | Meyer et al. |
| 2002/0195693 | A1 | 12/2002 | Liu et al. |
| 2003/0038464 | A1 | 2/2003 | Furui |
| 2003/0209784 | A1 | 11/2003 | Schmitz et al. |
| 2004/0094826 | A1 | 5/2004 | Yang et al. |
| 2004/0135220 | A1 | 7/2004 | Goto |
| 2004/0135574 | A1 | 7/2004 | Hagio |
| 2004/0174655 | A1 | 9/2004 | Tsai et al. |
| 2004/0207035 | A1 | 10/2004 | Witcraft et al. |
| 2004/0207077 | A1 | 10/2004 | Leal et al. |
| 2004/0207400 | A1 | 10/2004 | Witcraft et al. |
| 2004/0262718 | A1 | 12/2004 | Ramakrishna |
| 2005/0035448 | A1 | 2/2005 | Hsu et al. |
| 2005/0040814 | A1 | 2/2005 | Vig et al. |
| 2005/0045359 | A1 | 3/2005 | Doogue et al. |
| 2005/0151448 | A1 | 7/2005 | Hikida et al. |
| 2005/0173783 | A1 | 8/2005 | Chow et al. |
| 2005/0224248 | A1 | 10/2005 | Gagnon et al. |
| 2005/0230843 | A1 | 10/2005 | Williams |
| 2005/0248005 | A1 | 11/2005 | Hayat-Dawoodi |
| 2005/0253507 | A1 | 11/2005 | Fujimura et al. |
| 2005/0270748 | A1 | 12/2005 | Hsu |
| 2005/0274982 | A1 | 12/2005 | Ueda et al. |
| 2006/0002147 | A1 | 1/2006 | Hong et al. |
| 2006/0038289 | A1 | 2/2006 | Hsu et al. |
| 2006/0071655 | A1 | 4/2006 | Shoji |
| 2006/0077598 | A1 | 4/2006 | Taylor et al. |
| 2006/0091993 | A1 | 5/2006 | Shoji |
| 2006/0114098 | A1 | 6/2006 | Shoji |
| 2006/0145690 | A1 | 7/2006 | Shoji |
| 2006/0170529 | A1 | 8/2006 | Shoji |
| 2006/0175674 | A1 | 8/2006 | Taylor et al. |
| 2006/0181263 | A1 | 8/2006 | Doogue et al. |
| 2006/0219436 | A1 | 10/2006 | Taylor et al. |
| 2006/0267135 | A1 | 11/2006 | Wolfgang et al. |
| 2006/0291106 | A1 | 12/2006 | Shoji |
| 2007/0007631 | A1 | 1/2007 | Knittl |
| 2007/0018642 | A1 | 1/2007 | Ao |
| 2007/0044370 | A1 | 3/2007 | Shoji |
| 2007/0076332 | A1 | 4/2007 | Shoji |
| 2007/0090825 | A1 | 4/2007 | Shoji |
| 2007/0096716 | A1 | 5/2007 | Shoji |
| 2007/0138651 | A1 | 6/2007 | Hauenstein |
| 2007/0170533 | A1 | 7/2007 | Doogue et al. |
| 2007/0188946 | A1 | 8/2007 | Shoji |
| 2007/0241423 | A1 | 10/2007 | Taylor |
| 2007/0279053 | A1 | 12/2007 | Taylor et al. |
| 2008/0013298 | A1 | 1/2008 | Sharma et al. |
| 2008/0018261 | A1 | 1/2008 | Kastner |
| 2008/0034582 | A1 | 2/2008 | Taylor |
| 2008/0036453 | A1 | 2/2008 | Taylor |
| 2008/0297138 | A1 | 12/2008 | Taylor et al. |
| 2009/0058412 | A1 | 3/2009 | Taylor et al. |
| 2010/0019332 | A1 | 1/2010 | Taylor |

FOREIGN PATENT DOCUMENTS

| | | |
|---|---|---|
| DE | 4141386 | 6/1993 |
| DE | 102 31 194 A1 | 2/2004 |
| DE | 10 2004 054317 A1 | 5/2006 |
| EP | 0867725 | 9/1998 |
| EP | 0944839 | 9/1999 |
| EP | 1107327 | 6/2001 |
| EP | 1107328 | 6/2001 |
| EP | 1111693 | 6/2001 |

| | | |
|---|---|---|
| EP | 1180804 | 2/2002 |
| JP | 6171649 | 4/1986 |
| JP | 1 184885 A | 7/1989 |
| JP | 01207909 | 8/1989 |
| JP | 04364472 | 12/1992 |
| JP | 09 079865 | 3/1997 |
| JP | 2000174357 | 6/2000 |
| JP | 2001165963 | 6/2001 |
| JP | 2001174486 | 6/2001 |
| JP | 2001221815 | 8/2001 |
| JP | 2001230467 | 8/2001 |
| JP | 2001339109 | 12/2001 |
| JP | 2002026419 | 1/2002 |
| JP | 2002040058 | 2/2002 |
| JP | 2002202326 | 7/2002 |
| JP | 2002202327 | 7/2002 |
| WO | WO 9914605 | 3/1999 |
| WO | WO 0054068 | 9/2000 |
| WO | WO 0069045 | 11/2000 |
| WO | WO 01/23899 A1 | 4/2001 |
| WO | WO 01/74139 | 10/2001 |
| WO | WO 2005/013363 | 2/2005 |
| WO | WO 2005/026749 | 3/2005 |
| WO | WO 2006/130393 | 12/2006 |

OTHER PUBLICATIONS

Written Opinion of the International Searching Authority, PCT/US2010/056434 date of mailing Jan. 26, 2011, 10 pages.
U.S. Appl. No. 11/279,780, filed Apr. 14, 2006, 17 pages.
U.S. Appl. No. 11/554,619, filed Oct. 31, 2006, 170 pages.
U.S. Appl. No. 11/877,144, filed Oct. 23, 2007, 164 pages.
U.S. Appl. No. 12/171,651, filed Jul. 11, 2008, 27 pages.
U.S. Appl. No. 11/383,021, filed May 12, 2006, 669 pages.
U.S. Appl. No. 12/171,651, filed Jul. 11, 2008, 2419 pages.
Notification of Transmittal of the International Search Report and the Written Opinion of the International Searching Authority, or the Declaration; PCT/US2007/008920 dated Oct. 23, 2007.
Written Opinion of the International Searching Authority; PCT/US2007/008920 dated Oct. 23, 2007.
Second and Supplementary Notice Informing the Applicant of the Communication of the International Application (to Designated Office Which Apply the 30 Month Time Limit Under Article 22(1)); PCT/US2007/008920 dated Aug. 14, 2008.
Notification Concerning Transmittal of International Preliminary Report on Patentability (Chapter I of the Patent Cooperation Treaty) PCT/US2007/008920 dated Oct. 23, 2008.
Infineon Technologies, Differential Two-Wire Hall Effect Sensor-IC for Wheel Speed Applications with Direction Detection, Feb. 2005, pp. 1-32, vol. 3.1.
Infineon Technologies, Smart Hall Effect Sensor for Camshaft Applications, 2003, pp. 1-2.
Allegro Microsystems, Inc., Dynamic Self-Calibrating Peak-Detecting Differential Hall Effect Gear Tooth Sensor, pp. 1-14, Worcester, Massachusetts, 2005.
Allegro Microsystems, Inc., Hall-Effect IC Applications Guide, pp. 1-36, 2005.
Allegro Microsystems, Inc., Dynamic Self-Calibrating Peak-Detecting Differential Hall Effect Gear Tooth Sensor, Mar. 22, 2006, pp. 1-2.
Allegro Microsystems, Inc., Two-Wire True Zero-Speed Miniature Differential Peak-Detecting Sensor with Continuous Calibration, pp. 1-13, 2005.
Allegro Microsystems, Inc., Two-Wire True Zero-Speed Miniature Differential Peak-Detecting Sensor with Continuous Calibration, Mar. 22, 2006, pp. 1-2.
Mario Motz, Dieter Draxelmayr, Tobias Werth & Bernhard Forster, A Chopped Hall Sensor With Small Jitter and Programmable "True Power-On" Function, IEEE Journal of Solid-State Circuits, vol. 40, No. 7, Jul. 2005, pp. 1533-1540.
Gagnon; "Current Sensor" U.S. Appl. No. 11/144,970, filed Jun. 3, 2005.
Mangtani; "Current Sensor" U.S. Appl. No. 11/336,602, filed Nov. 10, 2006.
Doogue; "Current Sensor" U.S. Appl. No. 11/401,160, filed Apr. 10, 2006.
Taylor; "Current Sensor" U.S. Appl. No. 11/383,021, filed May 12, 2006.
Notification of transmittal of the International Search Report and the Written Opinion of the International Searching Authority, or the Declaration dated Sep. 25, 2006, PCT/US2006/019953, 4 pages.
Written Opinion of the International Searching Authority dated Sep. 25, 2006, PCT/US2006/019953, 5 pages.
Notification of transmittal of the International Search Report and the Written Opinion of the International Searching Authority, dated Feb. 28, 2008, PCT/US2007/013358, 5 pages.
Written Opinion of the International Searching Authority dated Feb. 28, 2008, PCT/US2007/013358, 7 pages.
Hashemi, "The Close Attached Capacitor: A Solution to Switching Noise Problems", IEEE Transactions on Components, Hybrids, and Manufacturing Technology, IEEE Inc. New York, US, vol. 15, No. 6, Dec. 1, 1992 (Feb. 1, 1992), pp. 1056-1063, XP000364765. ISSN: 0148-6411.
Chinese Office Action for Chinese National Stage Application No. CN 2004 80024296.5 dated Apr. 29, 2009 (PCT/US2004/009908).
Chinese Office Action for Chinese National Stage Application No. CN 2004 80024296.5 dated Sep. 26, 2008 (PCT/US2004/009908).
Chinese Office Action for Chinese National Stage Application No. CN 2004 80024296.5 dated May 6, 2008 (PCT/US2004/009908).
Chinese Office Action for Chinese National Stage Application No. CN 2004 80024296.5 dated Nov. 23, 2007 (PCT/US2004/009908).
Clemson University Vehicular Electronics Laboratory; "Electromagnetic Compatibility;" inet: http://www.cvel.clemson.edu/emc/tutorials/Shielding02/Practical_Shielding.html; 9 sheets, 2009.
EP Office Action dated Jun. 17, 2009; for EP Pat. App. No. 048163162.4.
EP Search Report of the EPO for EP 09000123.1 dated Jan. 22, 2010.
EP Search Report of the EPO for EP 09000121.5 dated Feb. 10, 2010.
European Office Action for European National Stage Application No. EP 04816162.4 dated Jan. 2, 2008 (PCT/US2004/009908).
European Office Action for European National Stage Application No. EP 04816162.4 dated Jun. 27, 2007 (PCT/US2004/009908).
Japanese Final Office Action for Japanese National Stage Application No. JP 2006-524610 dated Apr. 23, 2009 (PCT/US2004/009908).
Japanese Office Action dated Sep. 21, 2010 for JP2008-513632; English Translation; 2 pages.
Japanese Office Action for Japanese National Stage Application No. JP 2006-524610 dated Sep. 10, 2008 (PCT/US2004/009908).
Japanese Office Action for Japanese National Stage Application No. JP 2006-524610 dated Jul. 10, 2008 (PCT/US2004/009908).
Korean Amendment to Office Action dated Jul. 22, 2010 for KR 10-2006-7002842; English Translation; 7 pages.
Korean Office Action (with English translation) dated Jul. 22, 2010 for KR Application No. 10-2006-7002842.
Korean Response to Office Action dated Jul. 22, 2010 for KR 10-2006-7002842; English Translation; 11 pages.
Lee et al.; "Fine Pitch Au-SnAgCu Joint-in-via Flip-Chip Packaging;" IEEE 9$^{th}$ Electronics Packaging Technology Conference, Dec. 10-12, 2007; pp. 1-7.
Mosbarger et al.; "The Effects of Materials and Post-Mold Profiles on Plastic Encapsulated Integrated Circuits;" IEEE/IRPS; Apr. 1994; pp. 93-100.
Notification Concerning Transmittal of International Preliminary Report on Patentability (Chapter 1 of the Patent Cooperation Treaty), International Preliminary Report on Patentability, Written Opinion of the International Searching Authority, PCT/US2007/013358 dated Jan. 22, 2009, 7 pages.
Notification Concerning Transmittal of International Preliminary Report on Patentability (Chapter 1 of the Patent Cooperation Treaty), PCT/US2009/054254, date of mailing Mar. 10, 2011, 2 pages.
Written Opinion of the International Searching Authority, PCT/US2009/054254, date of mailing Mar. 10, 2011, 12 pages.
Notification of Transmittal of the International Search Report and Written Opinion of the International Searching Authority for PCT/US2004/009908 dated Aug. 16, 2004, 6 pages.
Written Opinion of the International Searching Authority, PCT/US2004/009908 dated Aug. 16, 2004, 7 pages.

Notification of Transmittal of the International Search Report and the Written Opinion of the International Searching Authority, or the Declaration; PCT/US2009/054254 dated Jun. 2, 2010, 8 pages.

Written Opinion of the International Searching Authority; PCT/US2009/054254 dated Jun. 2, 2010, 14 pages.

Steiner, et al.; "Fully Packaged CMOS Current Monitor Using Lead-on-Chip Technology;" Physical Electronics Laboratory, ETH Zurich, CH8093 Zurich, Switzerland; No. 0-7803-4412-X/98; IEEE 1998; pp. 603-608.

True Zero-Speed Low-Jitter High Accuracy Gear Tooth Sensor, ATS625LSG, 2005, pp. 1-21, Allegro Microsystems, Inc., Worcester, MA.

Wibben J. et al., "A High-Efficiency DC-DC Converter Using 2 nH Integrated Inductors", IEEE Journal of Solid-State Circuits, IEEE Service Center, Piscataway, NJ, vol. 43, No. 4, Apr. 1, 2008, pp. 844-854, XP011206706, ISSN: 0018-9200.

Wikipedia; "Electromagnetic Field;" inet: http://en.wikipedia.org/wiki/Electromagnetic_field; 7 sheets, Dec. 22, 2009.

Wikipedia; "Electromagnetic Shielding;" inet: http://en.wikipedia.org/wiki/Electromagnetic_shielding; 3 sheets, Dec. 22, 2009.

Wikipedia; "Magnetic Field;" inet: http://en.wikipedia.org/wiki/Magnetic_field; 25 sheets, Dec. 22, 2009.

U.S. Appl. No. 12/198,191, filed Aug. 26, 2008, 354 pages.

U.S. Appl. No. 12/630,362, filed Dec. 3, 2009, 187 pages.

U.S. Appl. No. 11/457,626, filed Jul. 14, 2006, 1199 pages.

U.S. Appl. No. 12/261,629, filed Oct. 30, 2008, 848 pages.

Taylor; "Integrated Sensor Having a Magnetic Flux Concentrator" U.S. Appl. No. 11/051,124, filed Feb. 4, 2005.

Taylor; "Resistor Having a Predetermined Temperature Coefficient" U.S. Appl. No. 10/962,889, filed Oct. 12, 2004.

Doogue; "Arrangements For An Integrated Sensor" U.S. Appl. No. 11/335,944, filed Jan. 20, 2006.

Taylor; "Integrated Magnetic Flux Concentrator" U.S. Appl. No. 11/129,933, filed May 16, 2005.

U.S. Appl. No. 11/279,780, filed Apr. 14, 2006.

U.S. Appl. No. 11/554,619, filed Oct. 31, 2006.

U.S. Appl. No. 11/877,144, filed Oct. 23, 2007.

U.S. Appl. No. 11/877,100, filed Oct. 23, 2007.

METHODS AND APPARATUS FOR INTEGRATED CIRCUIT HAVING ON CHIP CAPACITOR WITH EDDY CURRENT REDUCTIONS

BACKGROUND

As is known in the art, there are a variety of sensors that are useful for particular applications. For example, magnetic sensors are useful to detect movement, such as rotation, of an object of interest. Typically, Hall-effect sensors require a discrete decoupling capacitor component placed on or near the sensor to enhance EMC (Electromagnetic Compatibility) and reduce so-called long-wire noise problems. However, external capacitors incur added cost and processing at the individual device level. External capacitors also increase the total package size if the capacitor resides on the leadframe or requires an additional printed circuit board.

SUMMARY

The present invention provides a magnetic sensor including an on chip capacitor formed from first and second conductive layers and a dielectric layer disposed over a substrate. With this arrangement, the need for an external decoupling capacitor may be eliminated. While the invention is primarily shown and described in conjunction with particular layer stack ups, devices and configurations, it is understood that the invention is applicable to circuits in general in which it is desirable to provide a capacitive impedance.

In one aspect of the invention, a magnetic sensor comprises a plurality of layers including a substrate including circuitry, at least one conductive layer to interconnect the circuitry, and an insulator layer to electrically insulate the at least one conductive layer. First and second conductive layers are disposed above the substrate, and a dielectric layer is disposed between the first and second conductive layers such that the first and second conductive layers and the dielectric layer form a capacitor. The sensor further includes a first terminal electrically connected to the first conductive layer and a second terminal electrically connected to the second conductive layer.

In another aspect of the invention, a method includes forming a first conductive layer over a substrate containing circuitry, forming a dielectric layer over the first conductive layer, and, forming a second conductive layer over the dielectric layer such that the first conductive layer, the dielectric layer, and the second conductive layer form a first capacitor. A first terminal can be coupled to the first conductive layer and a second terminal can be coupled to the second conductive layer.

In a further aspect of the invention, an integrated circuit comprises a first substrate including circuitry, at least one conductive layer to interconnect the circuitry, an insulator layer to electrically insulate the at least one conductive layer, first and second conductive layers generally parallel to the substrate, a first dielectric layer disposed between the first and second conductive layers such that the first and second conductive layers and the first dielectric layer form a first on chip capacitor, and a second substrate in communication with the first substrate.

In another aspect of the invention, a method comprises forming a first conductive layer on a first substrate containing circuitry, forming a first dielectric layer on the first conductive layer, forming a second conductive layer on the first dielectric layer such that the first conductive layer, the first dielectric layer, and the second conductive layer form a first on chip capacitor, providing first and second terminals, wherein the first terminal is coupled to the first conductive layer and the second terminal is coupled to the second conductive layer, and coupling a second substrate to the first substrate.

In another aspect of the invention, an integrated circuit comprises a substrate having a magnetic field sensor, first and second conductive layers generally parallel to the substrate, and a dielectric layer disposed between the first and second conductive layers such that the first and second conductive layers and the dielectric layer form a capacitor, wherein a slot is formed in at least one of the first and second conductive layers proximate the magnetic field sensor for reducing eddy currents in the first and second conductive layers.

The integrated circuit can further include one or more of the following features: the substrate includes circuitry, and the integrated circuit further includes at least one conductive layer to interconnect the circuitry and an insulator layer to electrically insulate the at least one conductive layer, first and second terminals, wherein the first terminal is electrically connected to the first conductive layer and the second terminal is electrically connected to the second conductive layer, the slot includes a first slot in the first conductive layer and a second slot in the second conductive layer, wherein the first and second slots having different geometries, the slot includes a first slot in the first conductive layer and a second slot in the second conductive layer, wherein the first and second slots having substantially similar geometries, the slot extends from a point proximate the magnetic field sensor to an edge of the capacitor, the magnetic field sensor includes a Hall element, the magnetic field sensor includes a magnetoresistance element, the capacitor overlaps with at least thirty percent of an area of the substrate, the capacitor provides a capacitance from about 100 pF to about 1,500 pF for a substrate ranging in size from about 1 mm$^2$ to about 10 mm$^2$, the first terminal is adapted for coupling to a voltage supply terminal, the second terminal is adapted for coupling to a ground terminal, a second die in communication with the first die, the second die having third and fourth conductive layers and a second dielectric layer forming a second on-chip capacitor on the second die proximate a second magnetic field sensor, wherein the second capacitor includes a second capacitor slot including a slot in the third conductive layer to reduce eddy current flow, and the second capacitor slot further includes a slot in the fourth conductive layer, the first and second substrates are of different materials.

In a further aspect of the invention, a method comprises forming a first conductive layer generally parallel to a substrate containing circuitry, forming a dielectric layer for the first conductive layer, forming a second conductive layer over the dielectric layer such that the first conductive layer, the dielectric layer, and the second conductive layer form a first capacitor, forming a slot in the first conductive layer proximate a magnetic field element in the substrate, and providing first and second terminals, wherein the first terminal is coupled to the first conductive layer and the second terminal is coupled to the second conductive layer.

The method can further include one or more of the following features: the slot extends from a point proximate to the magnetic field sensor to an edge of the first capacitor, the capacitor overlaps with at least thirty percent of an area of the substrate, the magnetic field sensor includes a Hall sensor, the magnetic field sensor includes a magnetoresistance element, forming a second capacitor on a second substrate in communication with the first substrate, and forming a second slot in the second capacitor to reduce eddy currents associated with a second magnetic field sensor.

In another aspect of the invention, a vehicle comprises an integrated circuit including a substrate having a magnetic field sensor, first and second conductive layers generally parallel to the substrate, and a dielectric layer disposed between the first and second conductive layers such that the first and second conductive layers and the dielectric layer form a capacitor, wherein a slot is formed in at least one of the first and second conductive layers proximate the magnetic field sensor for reducing eddy currents in the first and second conductive layers.

BRIEF DESCRIPTION OF THE DRAWINGS

The foregoing features of this invention, as well as the invention itself, may be more fully understood from the following description of the drawings in which.

DETAILED DESCRIPTION

Figure 1A:
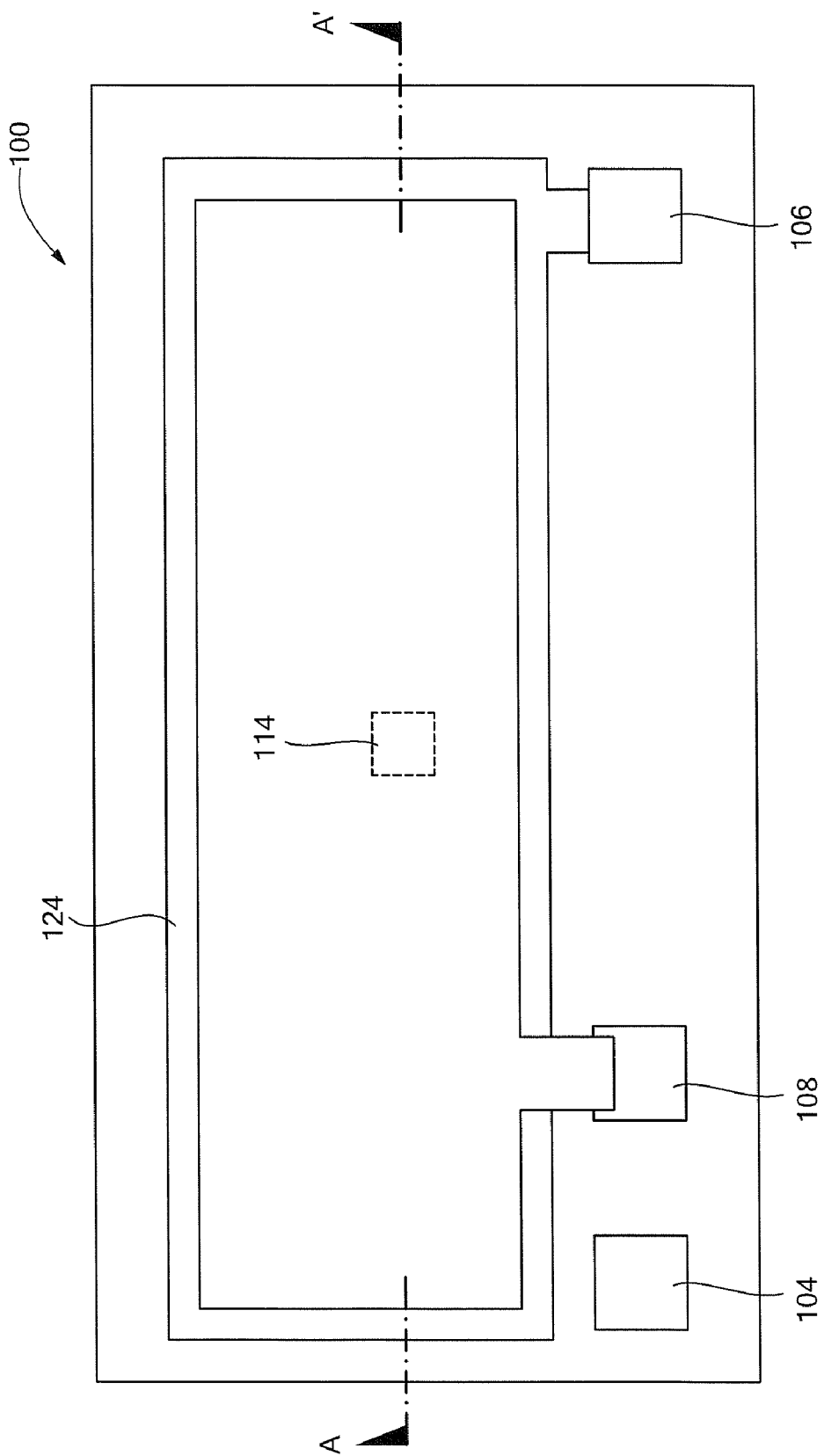
FIG. 1A is a top view of a sensor having an on chip capacitor in accordance with an exemplary embodiment of the invention.
Figure 1B:
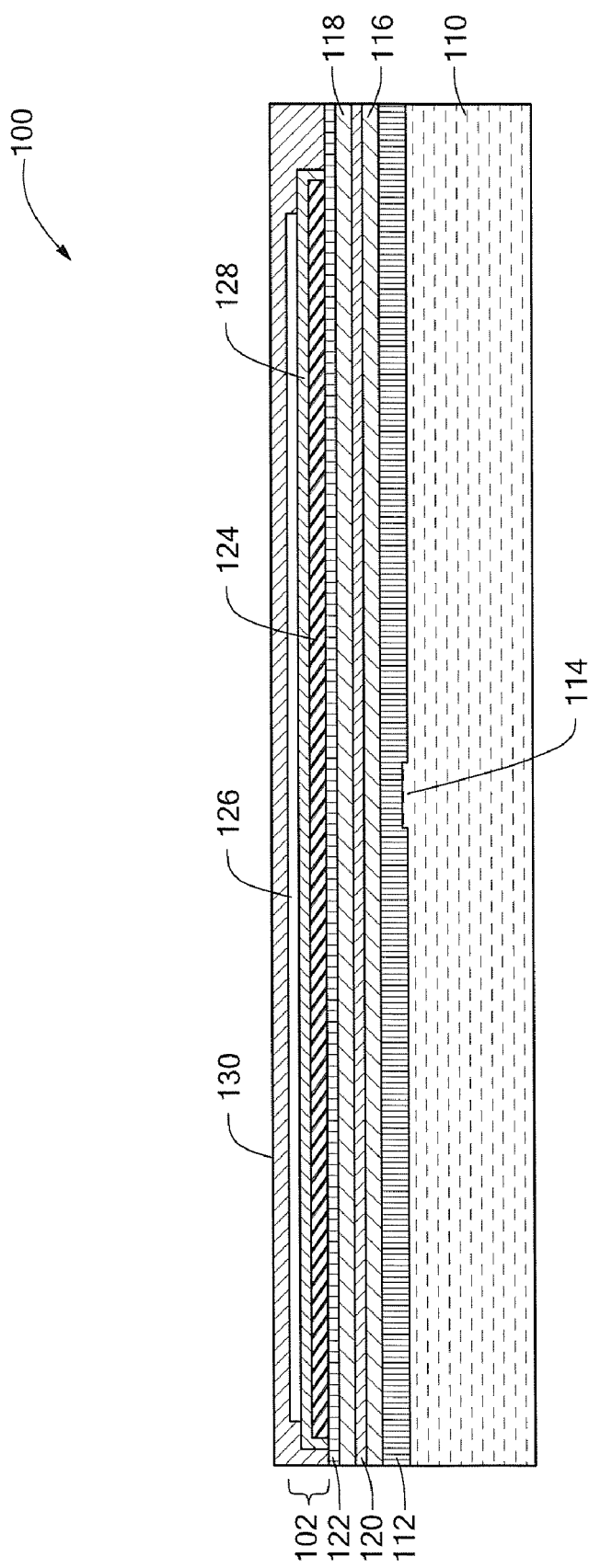
FIG. 1B is a cross-sectional view of the sensor of FIG. 1A taken along line A-A.

FIGS. 1A-B show an exemplary embodiment of a magnetic sensor 100 embodiment having an on chip capacitor 102 in accordance with the present invention. In the illustrated embodiment, the sensor 100 is a two-wire Hall effect type sensor having a VCC terminal 104 and a ground terminal 106. The capacitor 102 can be provided as a decoupling capacitor coupled between the VCC terminal 104 and the ground terminal 106, for example. As described more fully below, the capacitor 102 can be coupled to a VCC cap terminal 108, which is at the same potential as the VCC terminal 104 in an exemplary embodiment. The VCC cap terminal 108 and the VCC terminal 104 can be electrically coupled using any suitable technique, such as wire bonding. This arrangement allows breakdown testing. In alternative embodiments, VCC and VCC cap bond pads could be combined to form a single pad.

A first metal layer 110 is disposed on the substrate 116 and an optional second layer 118, which is sandwiched between first and second insulating layers 120, 122, is disposed over the first metal layer 116. The first and second metal layers 116, 118 provide, for example, interconnection and routing for the device layer 112. The first and second insulating layers 120, 122 can be provided, for example, as interlayer dielectric and/or passivation layers.

First and second conductive layers 124, 126 are separated by a dielectric material 128 to form the on chip capacitor 102 above the substrate. The capacitor 102 is covered by a further insulating layer 130. In an exemplary embodiment, the capacitor 102 is separated, and electrically isolated, from the second metal layer 118 by the second insulating layer 122.

In an exemplary embodiment, a substrate 110, e.g., silicon, includes an integrated circuit (IC) in layers 112, 116, 120, 118, and/or 122 in which circuitry is formed in a manner well known to one of ordinary skill in the art. The device layer 112 can include a Hall element 114 that forms part of the magnetic sensor 100. The device layer may include various layers necessary to form an integrated circuit, including, but not limited to, implant or doped layers, polysilicon, epi layers, oxide, or nitride layers.

While a particular layer stack tip is shown and described, it is understood that other embodiments having different layering orders and greater and fewer metal and other layers are within the scope of the invention. In addition, additional conductive layers can be added to form additional capacitors to meet the needs of a particular application.

Figure 2A:
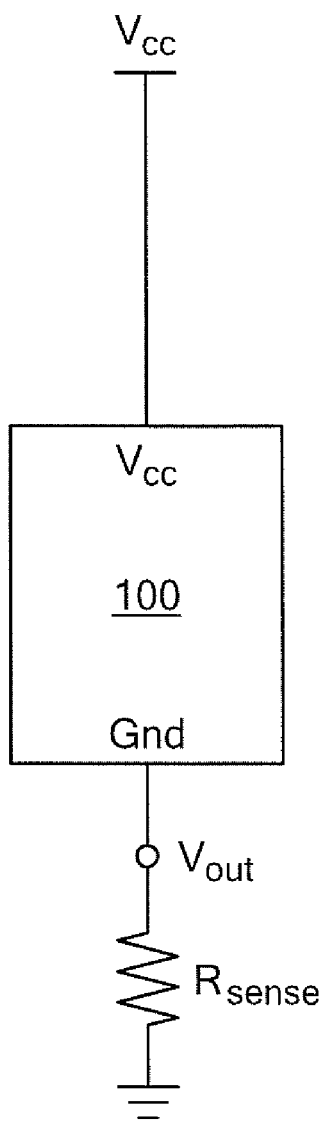
FIGS. 2A and 2B show a two-wire magnetic sensor having an on chip capacitor.
Figure 2B:
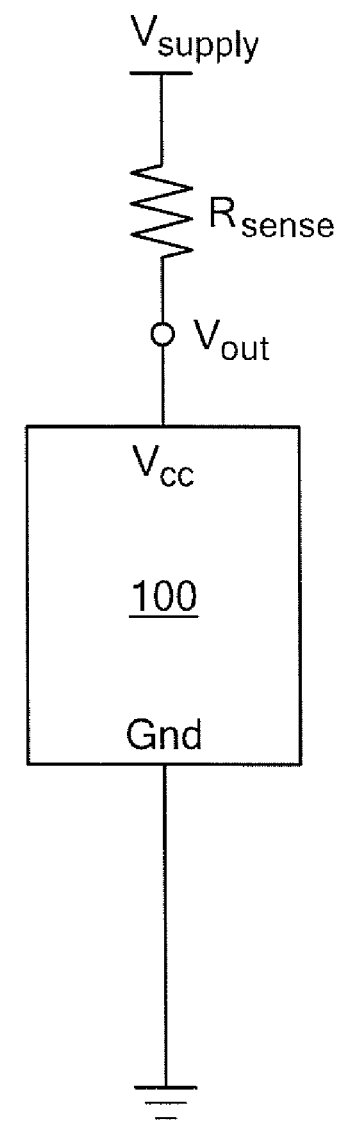

As shown in FIG. 2A, for the illustrated two-wire sensor, a sense resistor Rsense can be coupled between the ground terminal 106 and a ground connection, or as shown in FIG. 2B, the sense resistor Rsense can be coupled between the VCC terminal 104 and the power supply. This enables measurement of the sensor 100 output in the form of current changes in response to a positional displacement of a magnetic object of interest. By providing an on chip capacitor, the need for an external decoupling capacitor for the sensor may be eliminated.

Figure 3:
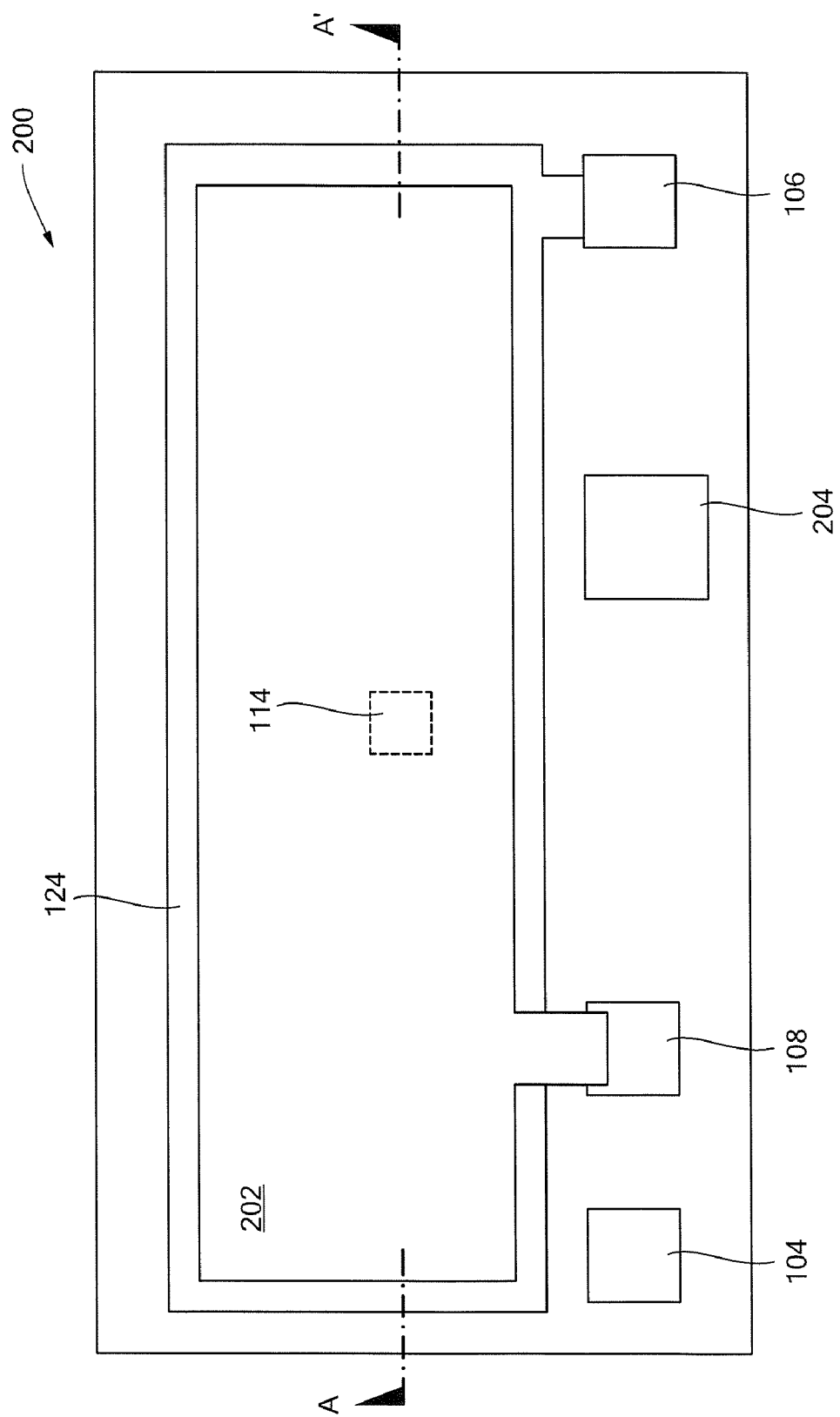
FIG. 3 is a pictorial top view of a three-wire magnetic sensor having an on chip capacitor.

In another embodiment shown in FIG. 3, a three-wire magnetic sensor 200 includes an on chip capacitor 202 with a Vout terminal 204 to provide a sensor output signal. The sensor 200 of FIG. 3 has some similarity with the sensor 100 of FIGS. 1A-1C, where like reference numbers indicate like elements.

It is understood that higher breakdown voltage requirements for the capacitor may limit the amount of capacitance that can be provided by the on chip capacitor. Lower breakdown voltage requirements may increase the amount of capacitance that can be provided. Factors that determine the characteristics of the on chip capacitor 102 include, for example, die size, metal layer area, conductive layer area, dielectric material, selected breakdown voltage, layer spacing, geometry, and others.

A variety of dielectric materials for the capacitor 166 can be used including, but not limited to; silicon nitride, silicon oxide, e.g. silicon dioxide, Tantalum oxide, Aluminum oxide, ceramics, glass, mica, polyesters (eg. Mylar), KAPTON, polyimides (e.g. Pyralin by HD Microsystems), benzocyclobutene (BCB, e.g. Cyclotene by Dow Chemical), and polynorbornene (e.g., Avatrel by Promerus). Inorganic dielectrics may be preferable for some applications based on their higher dielectric constant and the ability to create uniform thin films in the sub-micron range; e.g. 3,000 to 5,000 Angstroms in thickness.

These same dielectrics may be used where appropriate for interlayer dielectric, or final passivation materials. In the case of the interlayer dielectric, it may be advantageous to select a material that planarizes well, and has a low dielectric constant for use between the second metal layer 118 and the conductive layer 124. This should reduce any unwanted coupling of signals from lines on the metal layer 118 to the conductive layer 124, which may, for example, be a ground plane.

A variety of suitable materials can be used to provide the device layer for the sensor including silicon, gallium arsenide, silicon on insulator (SOI), and the like. In addition, various materials can be used to provide the metal layers and the conductive layers, which form the capacitor. Exemplary metal and conductive layer materials include copper, aluminum, alloys and/or other suitable metals.

In general, for a die size of about 2.5 to 3 $mm^2$, the on chip capacitor provides in the order of 400 pF. For a larger die, e.g., about 5 $mm^2$, the capacitor provides in the order of 800 pF. In exemplary embodiments, the capacitor provides a capacitance from about 100 pF to about 1,500 pF for a substrate ranging in size from about 1 $mm^2$ to about 10 $mm^2$.

In one particular embodiment, the first and second conductive layers 124, 126 (FIG. 1B) have dimensions of 2.3 $mm^2$. The dielectric material is silicon nitride having a thickness ranging of approximately 3,000 Å to about 5,000 Å. This arrangement provides a breakdown voltage of about at least 50V with a capacitance of about 300 pF to about 500 pF.

A Hall sensor having an on chip capacitor of about 100 pF to about 1,500 pF and at least 50V breakdown voltage is well suited for many vehicle applications, such as anti-lock brake sensors (ABS), linear position sensors, angle sensors, transmission sensors, cam sensors, and crank sensors.

In general, the first and second conductive layers 124, 126 (FIG. 1B) forming the capacitor 102 cover from about thirty percent to about ninety percent of the die area. The capacitor 102 may be above the die where above refers to some degree of overlap between generally parallel planes formed by the die and the conductive layers of the capacitor.

In one embodiment, the first and second layers cover an area of about eighty percent of the die area. Such a capacitor would provide a capacitance on the order of 400 pF, which can provide additional EMC protection to the circuitry on the die. In some devices, in the order of 200 pF may be sufficient for EMC or long-wire protection. In such a case the area required by the capacitor is not as large, and may be on the order of fifty percent of the total die area. In general, the capacitor can be sized to meet the needs of a particular application.

As used herein, the term die refers to a substrate, which may be a semiconductor or a semiconductor layer on an insulator, for example SOI substrates, with its associated circuits or electronic device elements. The circuits on the die may include semiconductor devices, for example diodes, and transistors, and passive devices, for example a resistor, inductor, or capacitor.

Figure 4:
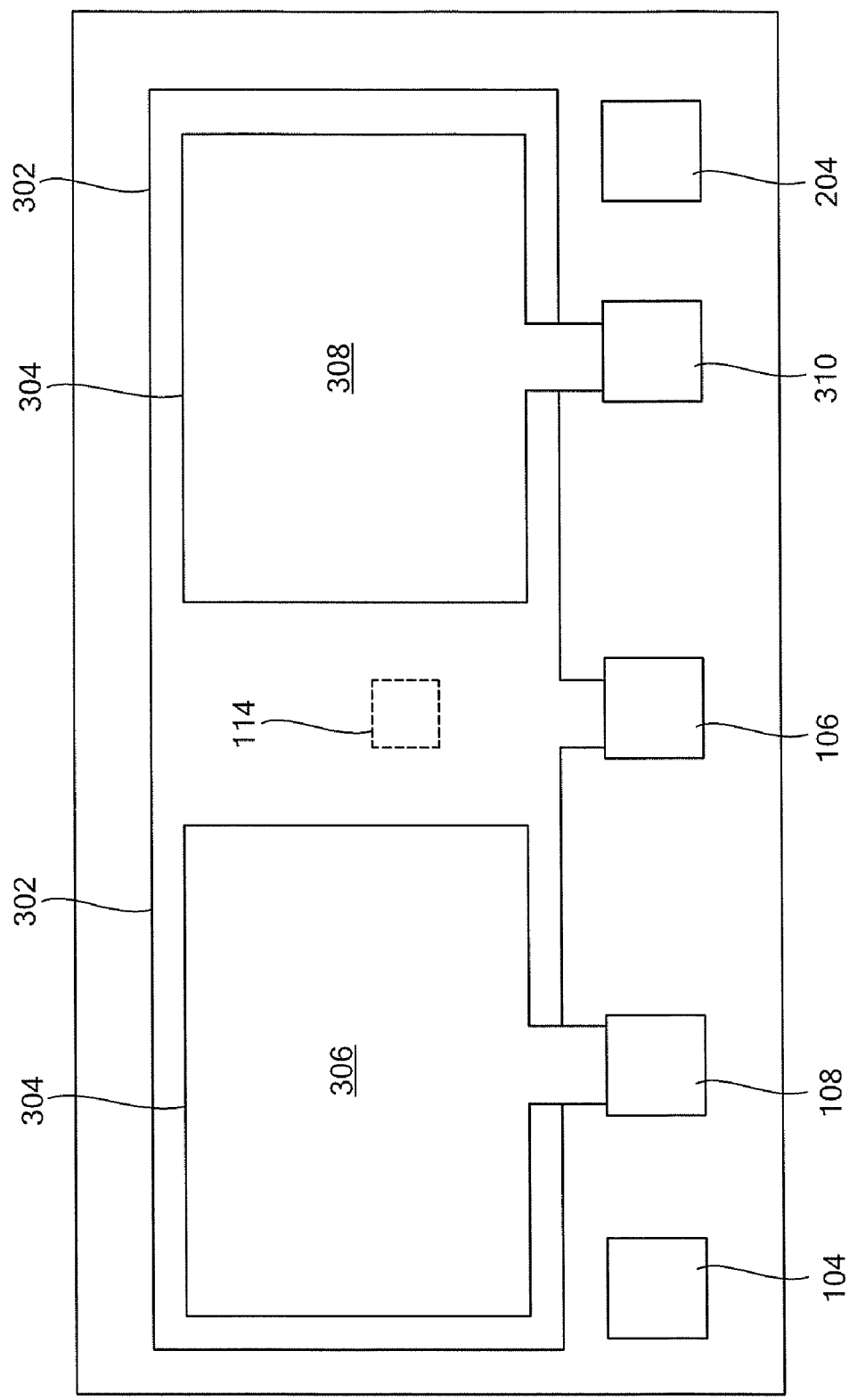
FIG. 4 is a schematic diagram of a sensor having multiple on chip capacitors.

As shown in FIG. 4, the second conductive layer 304 can be separated to form multiple capacitors, shown as first and second capacitors 306, 308 provided the first conductive layer 302 is at the same potential for both. It would also be apparent that the first conductive layer 302 could also be split to form separate capacitors, although it may require the addition of a bonding pad depending on the application. The first capacitor 306 provides a decoupling capacitor between the VCC cap terminal 108 and ground 106. The second capacitor 308 is coupled between a Vout cap terminal 310 and ground 106. A Vout terminal 204, which can be coupled to the Vout cap terminal 310 via wire-bond, provides a sensor output signal for a three-wire magnetic sensor, for example.

It is understood that the apportionment of the first and second conductive layers 302, 304 can be made to achieve capacitance requirements for a particular application. In addition, the first and second conductive layers can be split to form any practical number of capacitors above the die. Such multiple capacitor configurations may be useful for applications that require more than two-wires; for example a three-wire part with power, ground, and independent output pins.

Figure 5:
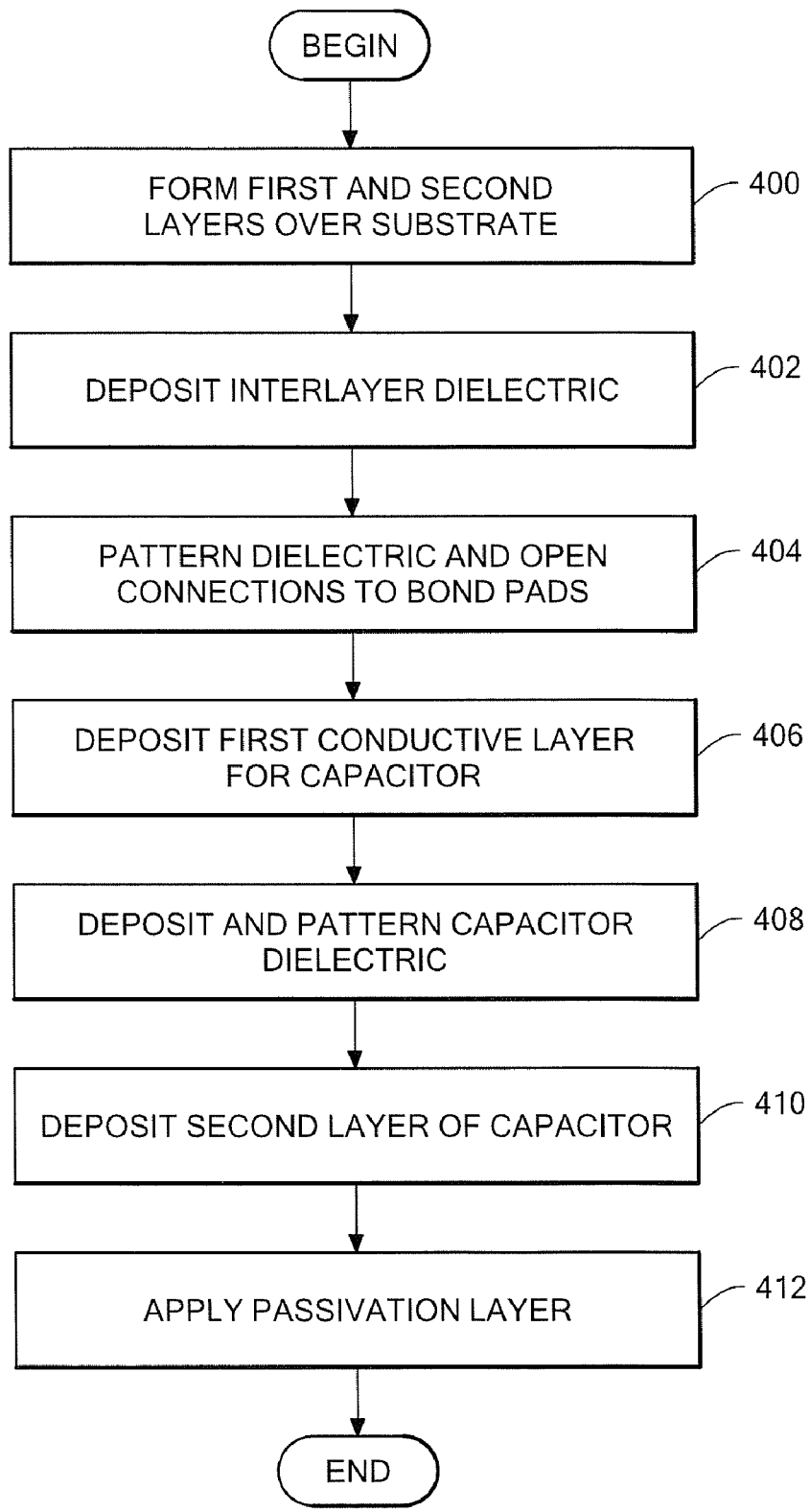
FIG. 5 is a flow diagram showing an exemplary sequence of steps to fabricate a sensor having an on chip capacitor.

FIG. 5 shows an exemplary sequence of steps to fabricate a sensor having an on-chip capacitor. In general, fabrication of the integrated capacitor is performed after an integrated circuit process is performed, which may also be referred to as the base process.

In step 400, first and second metal layers are formed over a substrate. In one particular embodiment, the base process includes two metal layers for interconnection and routing and a final passivation. It may be desirable to change the final passivation on the base process, which may typically include an oxide and nitride layer. After the second metal layer, in step 402 an interlayer dielectric is deposited. Again, this is the place where the final passivation would be performed in the base process. The interlayer dielectric can be an oxide, nitride, or organic dielectric such as a polyimide, or BCB. A material such as BCB has advantages in that it planarizes the underlying substrate well and allows a flat surface for the subsequent capacitor deposition. In step 404, the interlayer dielectric is then patterned to open connections to the bond pads in the underlying integrated circuit.

In step 406, a conductive layer is then deposited on the wafer and patterned to form one of the capacitor electrodes. In the illustrated embodiment, the lower capacitor electrode is connected to the ground bonding pad, but not any other portions of the underlying circuit. In some cases it may be desirable to have the lower capacitor layer on the other bonding pads of the integrated circuit, although these pads are not connected to the capacitor electrode. In step 408, the capacitor dielectric is deposited and patterned. The dielectric material may be silicon nitride, or other suitable material. In step 410, the second conductive layer of the capacitor is deposited on the wafer and patterned to form the top electrode of the capacitor. The upper layer of the capacitor may be connected to the Vcc pad of the integrated circuit, or it may be its own bonding pad. Having the upper layer of the capacitor as an independent pad allows the dielectric breakdown to be tested during the final test of the integrated circuit with an on-chip capacitor. In step 412, a final passivation layer is applied to the integrated circuit with the capacitor and pattern openings for the bonding pads.

Figure 6A:
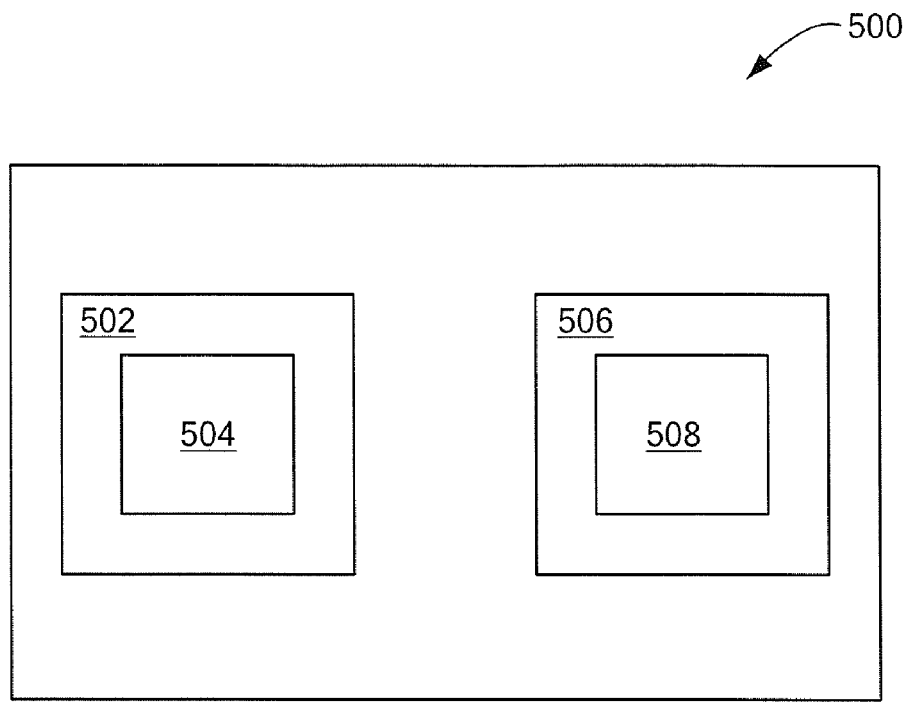
FIG. 6A is a schematic depiction of an integrated circuit having multiple chips having at least one respective on-chip capacitor in accordance with exemplary embodiments of the invention.
Figure 6B:
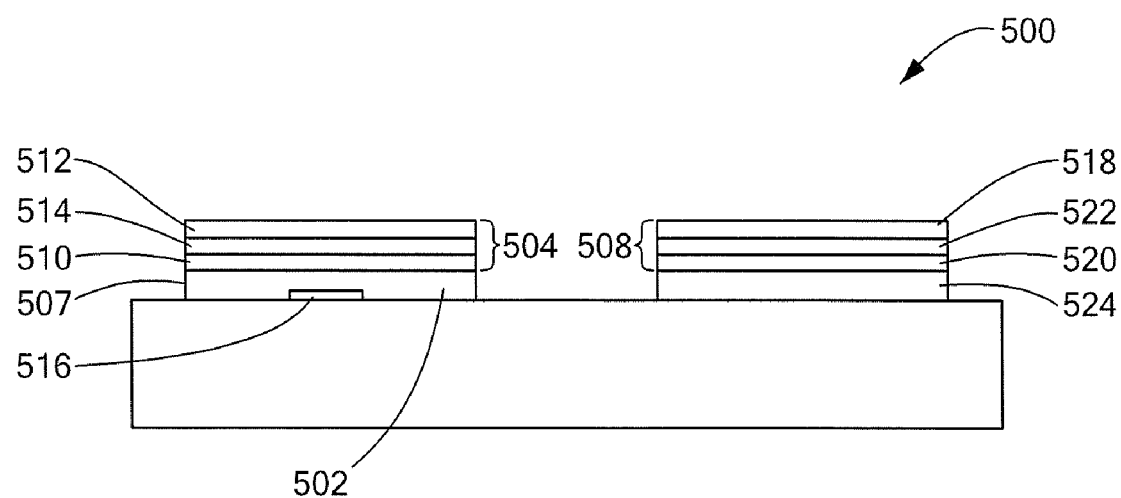
FIG. 6B is a side view of the integrated circuit of FIG. 6A.

FIGS. 6A and 6B shows an exemplary integrated circuit 500 having a first die 502 having a first on-chip capacitor 504 and a second die 506 having a second on-chip capacitor 508. The first capacitor 504, which can be disposed above a device layer 507, can include first and second conductive layers 510, 512 with a dielectric material 514 therebetween. An optional sensor element 516 can be formed in the first die 502.

The second capacitor 508 can similarly include third and fourth conductive layers 518, 520 and an insulative layer 522. The third conductive layers 518 can be disposed over a device layer 524 for the second die 506.

The first and second capacitors 504, 508 can be covered by respective optional insulating layers (not shown).

Figure 6C:
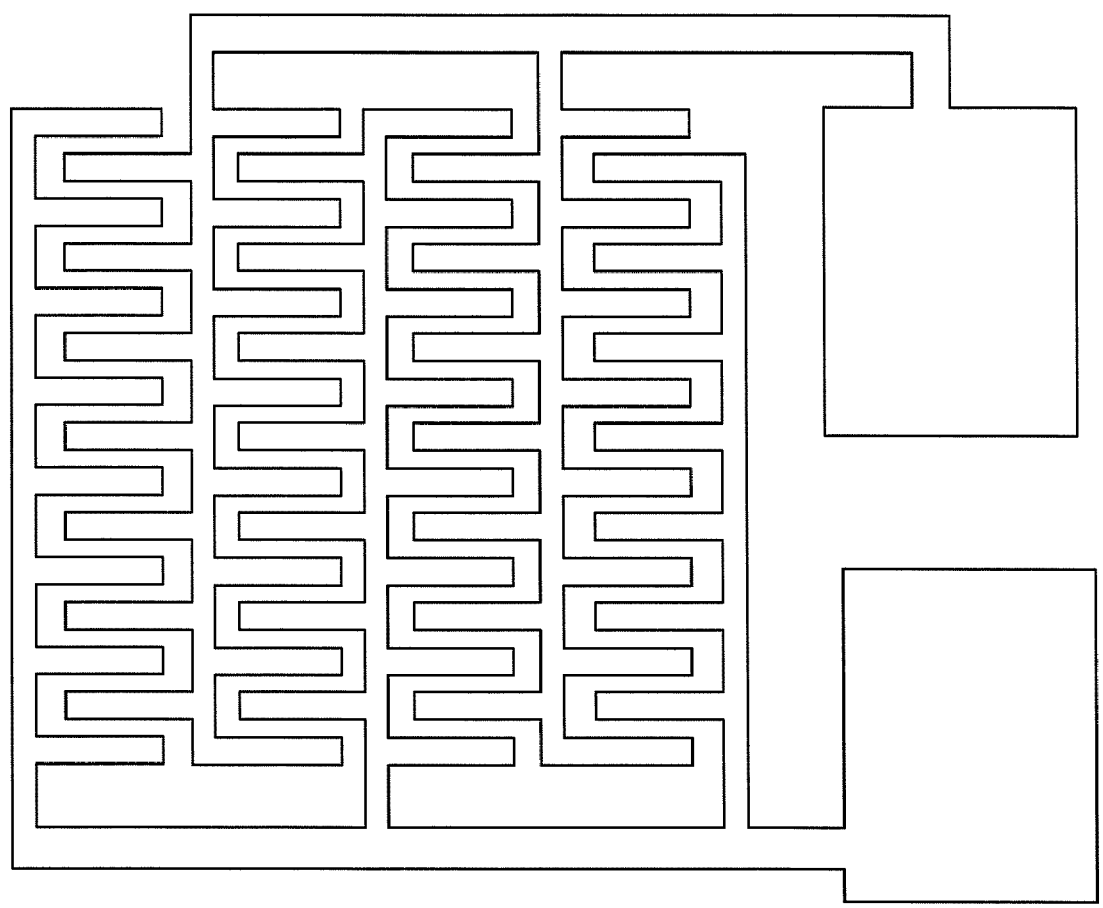
FIG. 6C is a pictorial representation of interdigitated on-chip capacitors.

While the first and second on chip capacitors are shown above the respective substrates, it is understood that in other embodiments, one or more of the on chip capacitors is below the respective substrate. In general, the conductive layers forming the on chip capacitors are generally parallel to the respective substrate. It is understood that the geometry of the capacitors can vary. For example, in another embodiment shown in FIG. 6C, one conductive layer, or multiple conductive layers, can be processed to form an on-chip interdigitated capacitor. In one embodiment, a single conductive layer is patterned to form an on-chip interdigitated capacitor. In another embodiment, multiple conductive layers can be patterned to form one or more on-chip interdigitated capacitors. It is understood that the properties of the dielectric material used to form the capacitors factors into the impedance of the capacitor.

It is understood that in other embodiments the first die 502 can have multiple on-chip capacitors. That is, the first and second metal layers 510, 512 can be divided, such as by etching, to form two on-chip capacitors for the first die. Similarly, the third and fourth conductive layers can be divided to provide multiple on-chip capacitors for the second die. In addition, one or both of the dies can have on-chip capacitors. Further, embodiments are contemplated with more than two dies with at least one of the dies having an on-chip capacitor. Other embodiments are contemplated having a variety of applications having a variety of configurations. For example, sensors, such as magnetic sensor elements, can be provided in one die, both dies, and/or multiple dies. Integrated circuits having on-chip capacitors can be provided as a wide variety of circuit types including sensors, system on a chip, processors, and the like.

In one embodiment, the first and second dies 502, 506 are formed from the same material, such as silicon. In other embodiments, the first and second dies are formed from different materials. Exemplary materials include Si, GaAs, InP, InSb, InGaAsP, SiGe, ceramic and glass.

Figure 7:
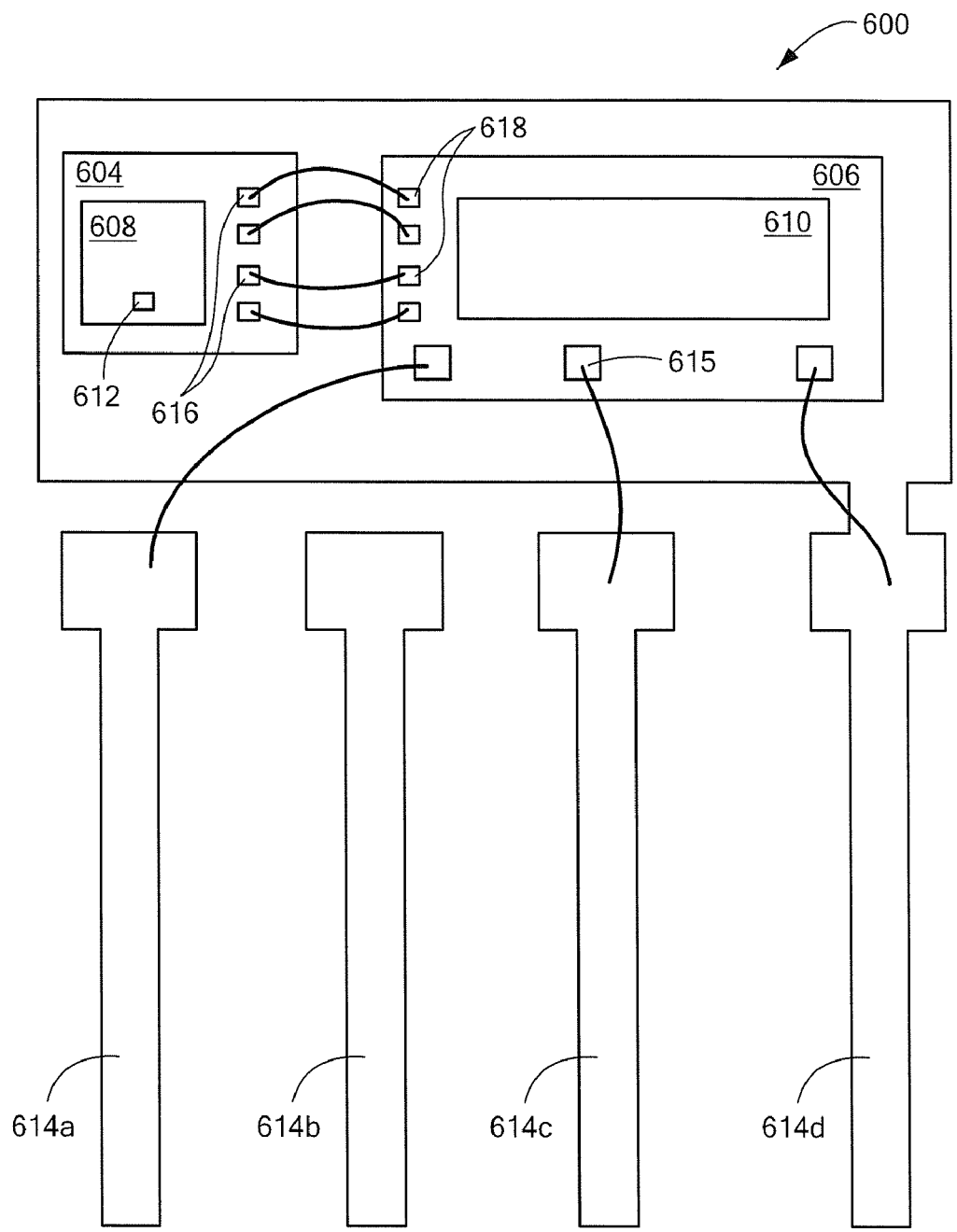
FIG. 7 is a pictorial representation of an integrated circuit having a first substrate with a first on-chip capacitor and a second substrate with a second on-chip capacitor in accordance with exemplary embodiments of the invention.

FIG. 7 shows an exemplary integrated circuit 600 having first and second dies 604, 606, each having respective on-chip capacitors 608, 610. The first die 604 includes a sensor element 612. In one particular embodiment, the sensor element is a Hall element. The second die 606 includes circuitry to support the sensor element 612 and provide output information, such as position output information for the sensor.

The integrated circuit 600 includes lead fingers 614a-d to provide input/output connections for the sensor. As described above, connections, such as wire bonds, can be made between the leadfingers 614 and input/output pads 615 on the second die 606. Connections/pads can be provided for ground, VCC, and/or signals. While not shown, it is understood that pads can also be provided for connections between the first die 604 and the lead fingers.

In addition, respective first and second die pads 616, 618 enable electrical connections between the first and second dies 604, 606. It is understood that any practical number of die pads can be provided for desired connections between the dies.

It is understood that the inventive multi-die embodiments can have a variety of configurations, such as flip chip embodiments.

Figure 8A:
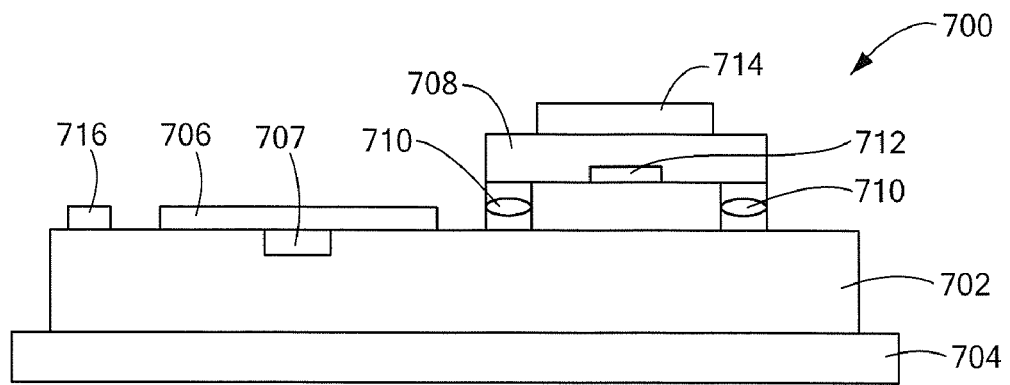
FIG. 8A is a side view of a multi-chip, multi on chip capacitor integrated circuit in a flip chip configuration in accordance with exemplary embodiments of the invention.
Figure 8B:
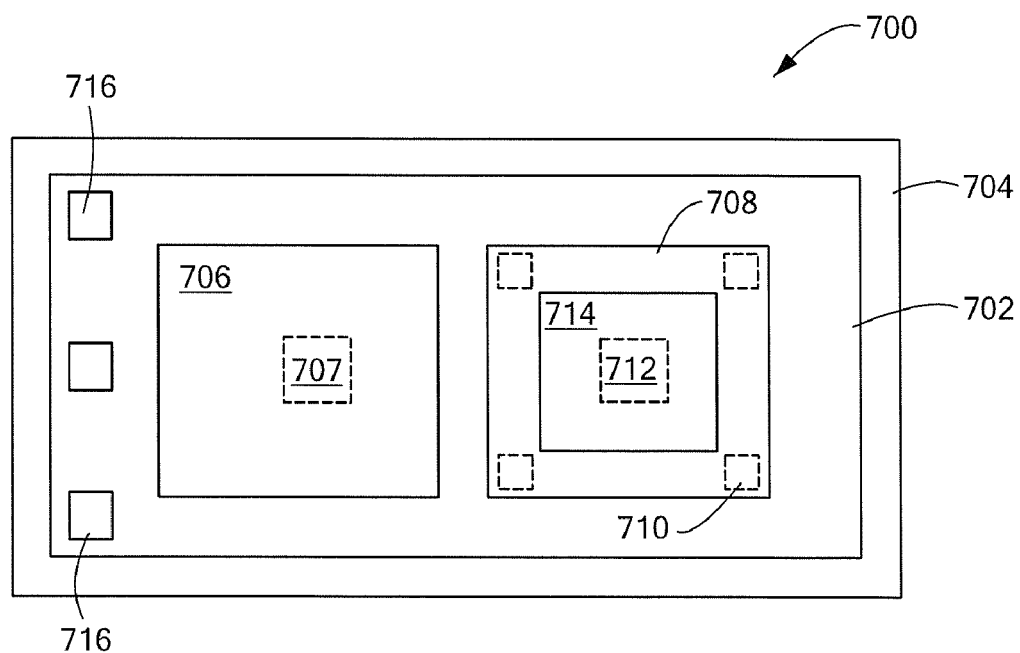
FIG. 8B is a top view of the flip chip configuration of FIG. 8A.

For example, FIGS. 8A and 8B show a flip-chip configuration having multiple dies with on-chip capacitors. An integrated circuit 700 includes a first die or substrate 702 disposed on a leadframe 704. A first on-chip capacitor 706 is formed over a portion of the first die 702. An optional sensor element 707 can be formed in the first die.

A second substrate or die 708 is coupled on top of the first die 702, such as by solder balls 710. The second die 708 can include a sensor element 712. A second on chip capacitor 714 is disposed on the second die 708.

Bonding wires can couple bonding pads 716 to lead fingers (not shown) on the lead frame.

As noted above, the first and second dies 702, 708 can be provided as the same material or different materials. Exemplary materials include Si, GaAs, InP, InSb, InGaAsP, SiGe, ceramic and glass. Further, sensing elements in the first and second dies can be the same type of device or different types of devices. Exemplary sensor elements include Hall effect, magnetoresistance, giant magnetresistance (GMR), anistropic magnetresistance (AMR), and tunneling magnetoresistance (TMR). The respective on chip capacitors 706, 714 can be sized to achieve a desired impedance, as discussed above.

While the invention is primarily shown and described in conjunction with integrated circuit sensors, and particularly magnetic sensors, it is understood that the invention is applicable to integrated circuits in general for which it is desirable to provide a capacitor. In addition, while the on-chip capacitors are shown above a die it is understood that embodiments are contemplated in which the on chip capacitor is below the die. That is, the conductive layers forming the on-chip capacitor are generally parallel with the plane in which the die rests. In one embodiment, interdigitated electrodes could also be used to form on-chip capacitors in a single layer of metal.

Figure 9:
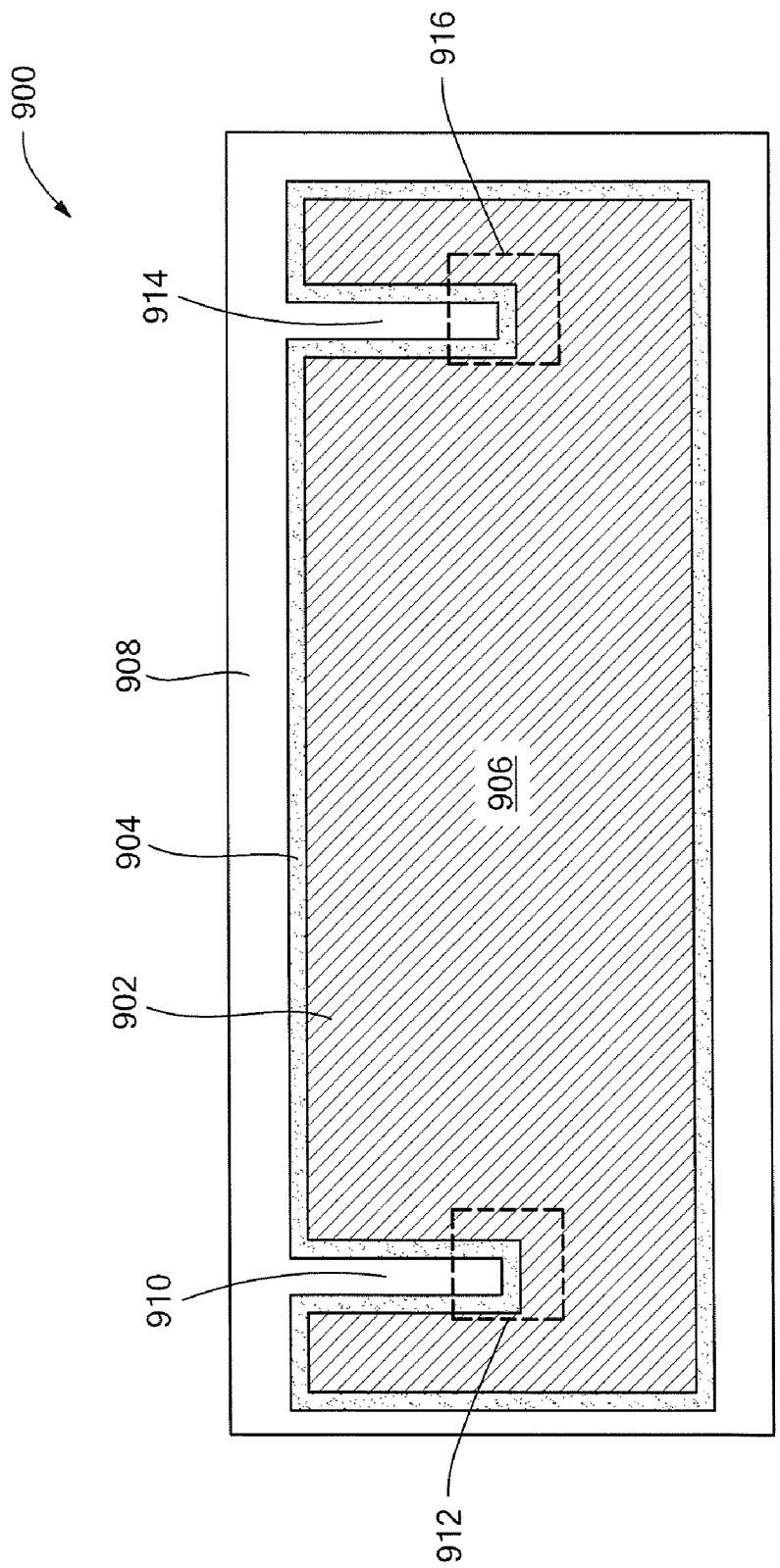
FIG. 9 is a schematic representation of an on chip capacitor having eddy current reduction.

It is understood that a variety of suitable fabrication processes can be used to form a sensor having an on chip capacitor including, but not limited to, bipolar, DMOS, bi-CMOS, CMOS, and processes and combinations of these and other processes FIG. 9 shows an exemplary capacitor-on-chip capacitor 900 having an upper layer 902 and a lower layer 904 forming a capacitor 906 over a die 908 with a first slot 910 formed in the capacitor layers to reduce eddy currents generated about a Hall element 912 in accordance with exemplary embodiments of the invention. In the illustrated embodiment a second slot 914 is formed in the capacitor layers about a second Hall element 916.

As is well known in the art, in the presence of an AC magnetic field (e.g., a magnetic field surrounding a current carrying conductor), AC eddy currents can be induced in the conductive layers. Eddy currents form into closed loops that tend to result in a smaller magnetic field so that a Hall effect element experiences a smaller magnetic field than it would otherwise experience, resulting in less sensitivity. Furthermore, if the magnetic field associated with the eddy current is not uniform or symmetrical about the Hall effect element, the Hall effect element might also generate an undesirable offset voltage.

The slot(s) 910 tends to reduce the total path (e.g., a diameter or path length) near the sensor, which reduces the eddy current effect of the closed loops in which the eddy currents travel in the conductive layers of the capacitor near a magnetic field sensor. It will be understood that the reduced size of the closed loops in which the eddy currents travel results in smaller eddy currents for a smaller local affect on the AC magnetic field that induced the eddy current. Therefore, the sensitivity of a current sensor or other device having a Hall effect element is less affected by eddy currents due to the slot(s).

Instead of an eddy current rotating about the Hall effect element, the slot 910 results in eddy currents to each side of the Hall element. While the magnetic fields resulting from the eddy currents are additive, the overall magnitude field strength, compared to a single eddy current with no slot, is lower due to the increased proximity of the eddy currents.

Figure 9A:
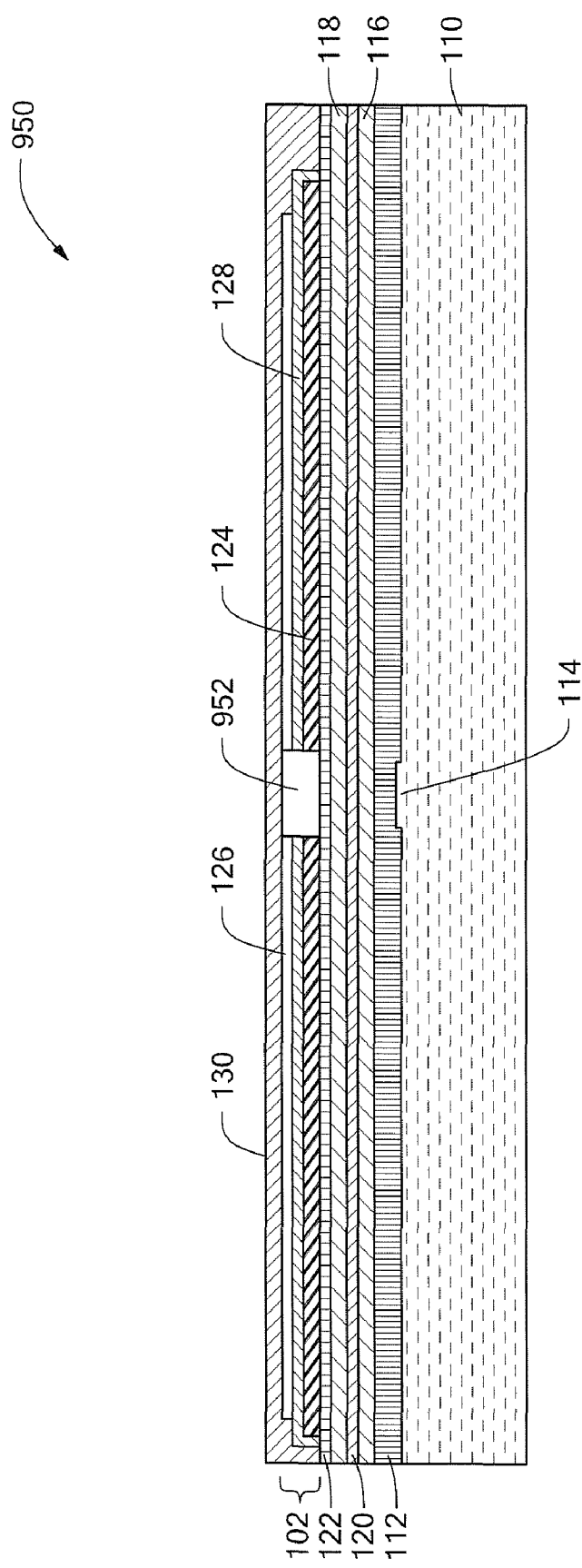
FIG. 9A is a schematic representation of a side view of an on chip capacitor configuration having eddy current reduction.

FIG. 9A shows a side cutaway view of a integrated circuit 950 including an on-chip capacitor having a slot 952 positioned in relation to a Hall element. The integrated circuit 950 has some commonality with the sensor of FIG. 1B, where like reference numbers indicate like elements. The slot 952 is formed in the conductive layers 124, 126 and the dielectric layer 128 forming the capacitor.

It is understood that any number of slots can be formed in a wide variety of configurations to meet the needs of a particular application. In the illustrative embodiment, slots are formed in the capacitor layers in relation to a Hall effect element located in the die, e.g., extending from a location proximate the Hall element to an edge of the capacitor. The slots reduce the eddy current flows about a Hall element and enhance the overall performance of the sensor/integrated circuit.

Figure 9B:
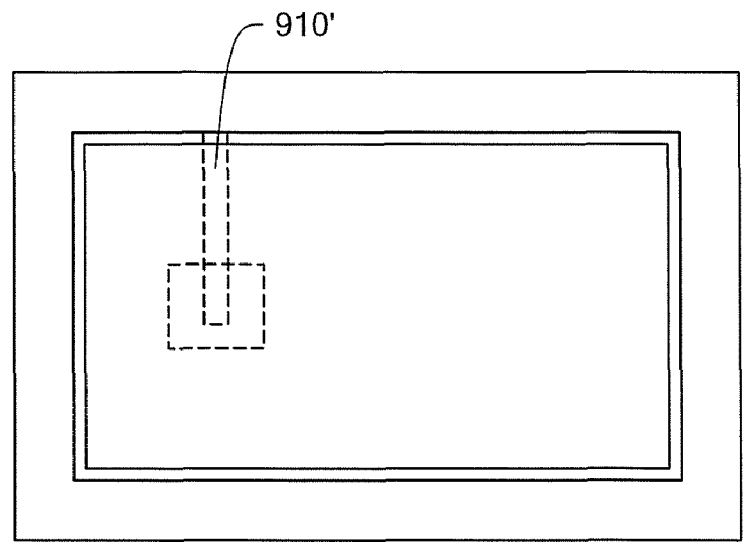
FIG. 9B is a further schematic representation of an on chip capacitor having eddy current reduction.

It is understood that the term slot should be broadly construed to cover interruptions in the conductivity of one and/or both of the capacitor layers. For example, slots can include a few relatively large holes as well as smaller holes in a relatively high density. In addition, the term slot is not intended to refer to any particular geometry. For example, slot includes a wide variety of regular and irregular shapes, such as tapers, ovals, etc. Further, it is understood that the direction/angle of the slot(s) can vary. Also, it will be apparent that it may be desirable to position the slot(s) based upon the type of sensor. It is understood that a slot can have different geometries in the upper and lower layer of the capacitor. For example, FIG. 9B shows a slot 910' formed in only the lower layer of the on-chip capacitor. This embodiment may shield the sensor from an external noise caused by, for example another electrical wire in the vicinity of the sensor.

In general, it may be preferable to have a slot in upper and lower plates of the on-chip capacitor. It is understood, however, that a slot only the lower plate, i.e., the plate closer to the magnetic sensor, will reduce eddy currents more than a slot only in the upper plate of the capacitor since the upper plate is further away than the lower plate, and thus, has less influence on the sensitivity of the magnetic sensor. In general, it is desirable to remove the conductors, i.e., the plates of the capacitor, over the Hall plate. A current directly over the Hall plate, or near the plate, will have more influence due to its geometry than one that is even tens of microns away.

Figure 10:
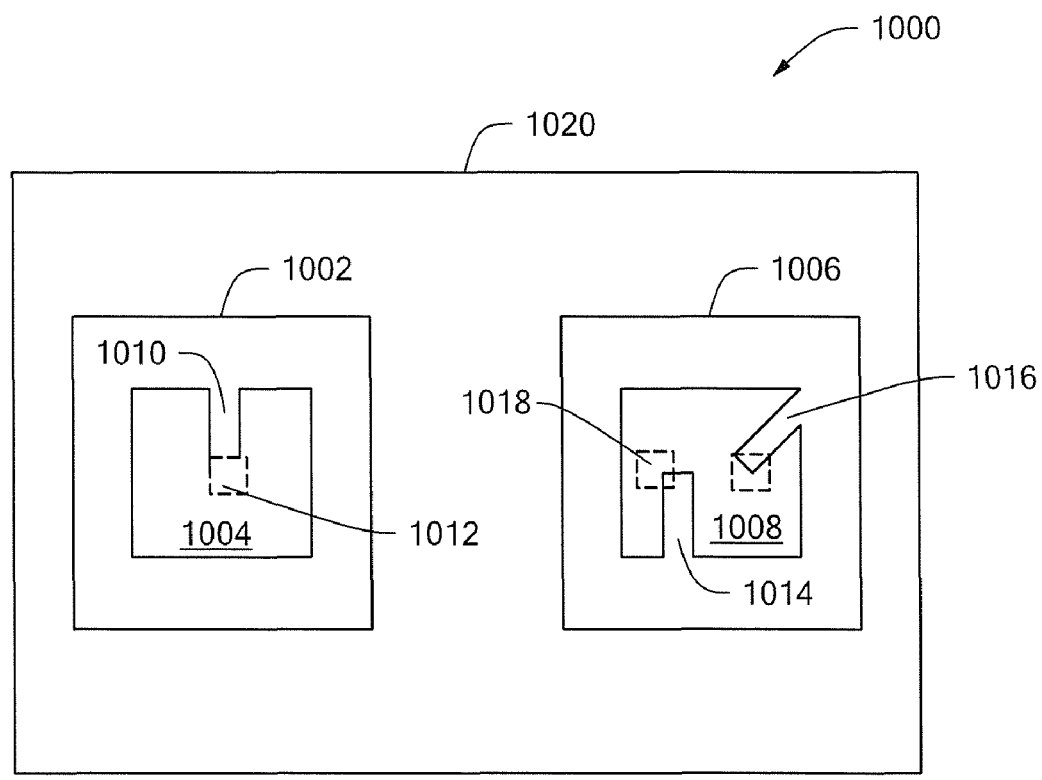
FIG. 10 is a schematic representation of first and second dies having respective on-chip capacitors with slots to reduce eddy currents.

FIG. 10 shows an exemplary multiple die embodiment including an integrated circuit 1000 having a first die 1002 having a first on-chip capacitor 1004 and a second die 1006 having a second on-chip capacitor 1008. The first capacitor 1004 includes a slot 1010 for reducing eddy currents proximate a magnetic sensor 1012. The second capacitor 1008 includes first and second eddy current reducing slots 1014, 1016 proximate a Hall element 1018.

The slots can have any practical geometry and orientation in relation to the magnetic sensor and/or die to meet the needs of a particular application. Slot 1016 is shown having one example configuration of a slot angled in relation to an edge of the capacitor.

The dies 1002, 1006 can be disposed on a layer 1020, which can be provided as part of a MCM (multi-chip module), a package substrate, such as a copper lead frame material, a third die, or a part of the package, such as a lead frame, etc.

Figure 11:
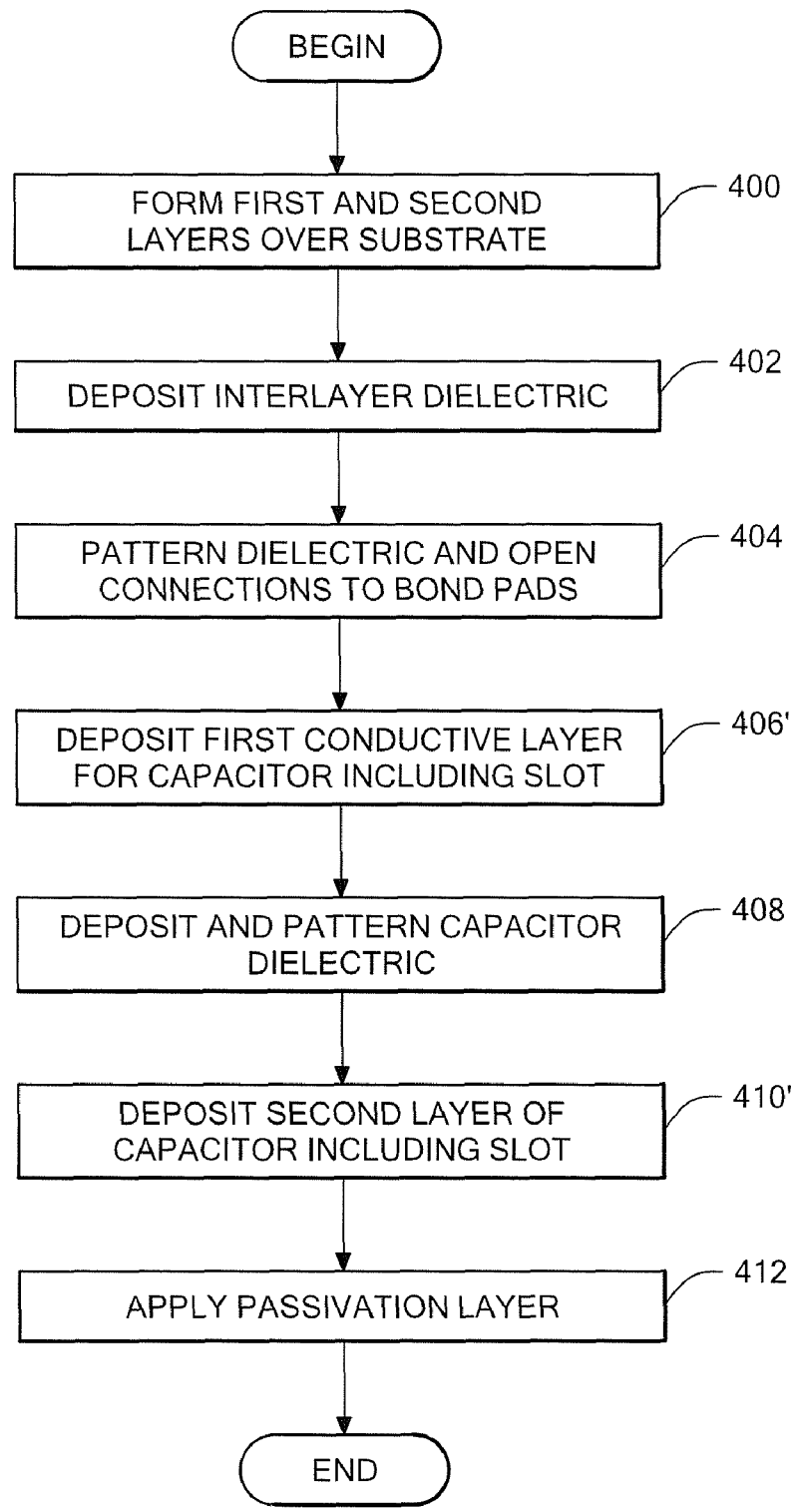
FIG. 11 is a flow diagram showing an exemplary sequence of steps for providing a capacitor on chip with eddy current reduction.

FIG. 11 shows an exemplary sequence of steps for providing eddy current reduction for an on-chip capacitor having some similarity to FIG. 5, in which like reference numbers indicate like elements. In an exemplary embodiment, step 406' includes patterning the first conductive layer to include a slot to reduce eddy currents. Similarly, step 410' includes patterning the second conductive layer to the slot.

It is understood that the steps in FIG. 11 can be readily modified, reordered, etc, to the meet the needs of a particular application. For example, patterning of the conductive layers and dielectric to include the slot can be provided using a single mask for each layer, or the slot can be formed after the capacitor is complete, such as by ion milling to open a slot in the capacitor. Other such variations will be readily apparent to one of ordinary skill in the art.

While exemplary embodiments contained herein discuss the use of a magnetic sensor and eddy current reduction, it will be apparent to one of ordinary skill in the art that other types of magnetic field sensors may also be used in place of or in combination with a Hall element. For example the device could use an anisotropic magnetoresistance (AMR) sensor and/or a Giant Magnetoresistance (GMR) sensor. In the case of GMR sensors, the GMR element is intended to cover the range of sensors comprised of multiple material stacks, for example: linear spin valves, a tunneling magnetoresistance (TMR), magnetic tunnel junction (MTJ) or a colossal magnetoresistance (CMR) sensor. In other embodiments, the sensor includes a back bias magnet. It is understood that the terms die and substrate are used interchangeably.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. An integrated circuit, comprising:
a substrate having a magnetic field sensor element;
first and second conductive layers generally parallel to the substrate;
a dielectric layer disposed between the first and second conductive layers such that the first and second conductive layers and the dielectric layer form a capacitor; and
first and second terminals, wherein the first terminal is electrically connected to the first conductive layer and the second terminal is electrically connected to the second conductive layer,
wherein the substrate includes circuitry, and the integrated circuit further includes at least one conductive layer to interconnect the circuitry and an insulator layer to electrically insulate the at least one conductive layer,
wherein a slot is formed in at least one of the first and second conductive layers proximate the magnetic field sensor element for reducing eddy currents in the first and second conductive layers,
wherein the slot in at least one of the first and second conductive layers overlaps with the magnetic field sensor element and extends to an edge of a first one of the first and second conductive layers.

2. The integrated circuit according to claim 1, wherein the slot includes a first slot in the first conductive layer and a second slot in the second conductive layer, wherein the first and second slots having different geometries.

3. The integrated circuit according to claim 1, wherein the slot includes a first slot in the first conductive layer and a second slot in the second conductive layer, wherein the first and second slots have substantially similar geometries.

4. The integrated circuit according to claim 1, wherein the magnetic field sensor element includes a Hall element.

5. The integrated circuit according to claim 1, wherein the magnetic field sensor element includes a magnetoresistance element.

6. The integrated circuit according to claim 1, wherein the capacitor overlaps with at least thirty percent of an area of the substrate.

7. The integrated circuit according to claim 1, wherein the capacitor provides a capacitance from about 100 pF to about 1,500 pF for a substrate ranging in size from about 1 mm$^2$ to about 10 mm$^2$.

8. The integrated circuit according to claim 1, wherein the first terminal is adapted for coupling to a voltage supply terminal.

9. The integrated circuit according to claim 8, wherein the second terminal is adapted for coupling to a ground terminal.

10. The integrated circuit according to claim 1, further including a second substrate in communication with the first substrate, the second substrate having third and fourth conductive layers and a second dielectric layer forming a second on-chip capacitor on the second substrate proximate a second magnetic field sensor element, wherein the second capacitor includes a second capacitor slot including a slot in the third conductive layer to reduce eddy current flow.

11. The integrated circuit according to 10, wherein the second capacitor slot further includes a slot in the fourth conductive layer.

12. The integrated circuit according to claim 10, wherein the first and second substrates are of different materials.

13. A method of providing a magnetic field sensor, comprising:
    forming a first conductive layer generally parallel to a substrate containing circuitry;
    forming a dielectric layer for the first conductive layer;
    forming a second conductive layer over the dielectric layer such that the first conductive layer, the dielectric layer, and the second conductive layer form a first capacitor;
    forming a slot in the first conductive layer proximate a magnetic field element in the substrate, wherein the slot in at least one of the first and second conductive layers overlaps with the magnetic field sensor and extends to an edge of a first one of the first and second conductive layers; and
    providing first and second terminals, wherein the first terminal is coupled to the first conductive layer and the second terminal is coupled to the second conductive layer.

14. The method according to claim 13, wherein the capacitor overlaps with at least thirty percent of an area of the substrate.

15. The method according to claim 13, wherein the magnetic field sensor includes a Hall sensor.

16. The method according to claim 13, wherein the magnetic field sensor includes a magnetoresistance element.

17. The method according to claim 13, further including forming a second capacitor on a second substrate in communication with the first substrate, and forming a second slot in the second capacitor to reduce eddy currents associated with a second magnetic field sensor.

18. A vehicle, comprising: An integrated circuit, comprising: a substrate having a magnetic field sensor; first and second conductive layers generally parallel to the substrate; and a dielectric layer disposed between the first and second conductive layers such that the first and second conductive layers and the dielectric layer form a capacitor, wherein a slot is formed in at least one of the first and second conductive layers proximate the magnetic field sensor for reducing eddy currents in the first and second conductive layers, wherein the slot in at least one of the first and second conductive layers overlaps with the magnetic field sensor and extends to an edge of a first one of the first and second conductive layers.

19. The vehicle according to claim 18, wherein the substrate includes circuitry, and the integrated circuit further includes at least one conductive interconnect layer to interconnect the circuitry and an insulator layer to electrically insulate the at least one conductive layer.

20. The vehicle according to claim 18, further including first and second terminals, wherein the first terminal is electrically connected to the first conductive layer and the second terminal is electrically connected to the second conductive layer.

21. The vehicle according to claim 18, wherein the slot includes a first slot in the first conductive layer and a second slot in the second conductive layer, wherein the first and second slots have different geometries.

22. An integrated circuit, comprising:
    a substrate having a magnetic field sensor;
    first and second conductive layers generally parallel to the substrate;
    a dielectric layer disposed between the first and second conductive layers such that the first and second conductive layers and the dielectric layer form a capacitor; and
    means for reducing eddy currents, wherein the means for reducing eddy currents includes a slot in at least one of the first and second conductive layers overlapping with the magnetic field sensor.

* * * * *

UNITED STATES PATENT AND TRADEMARK OFFICE
CERTIFICATE OF CORRECTION

| | | |
|---|---|---|
| PATENT NO. | : 8,093,670 B2 | |
| APPLICATION NO. | : 12/178781 | |
| DATED | : January 10, 2012 | |
| INVENTOR(S) | : William P. Taylor | |

It is certified that error appears in the above-identified patent and that said Letters Patent is hereby corrected as shown below:

Col. 4 line 34, delete "tip" and replace with -- up --.

Col. 6 line 66, delete "layers" and replace with -- layer --.

Col. 8 line 15, delete "magnetresistance" and replace with -- magnetoresistance --.

Col. 8 line 16, delete "magnetresistance" and replace with -- magnetoresistance --.

Col. 10 line 6, delete ", to the meet" and replace with -- , to meet --.

Signed and Sealed this
Twentieth Day of March, 2012

David J. Kappos
*Director of the United States Patent and Trademark Office*